US010644146B1

(12) United States Patent
Zitouni et al.

(10) Patent No.: US 10,644,146 B1
(45) Date of Patent: May 5, 2020

(54) VERTICAL BI-DIRECTIONAL SWITCHES AND METHOD FOR MAKING SAME

(71) Applicant: NXP USA, Inc., Austin, TX (US)

(72) Inventors: Moaniss Zitouni, Gilbert, AZ (US); Vishnu Khemka, Chandler, AZ (US); Ganming Qin, Chandler, AZ (US); Tanuj Saxena, Chandler, AZ (US); Raghuveer Vankayala Gupta, Austin, TX (US); Mark Edward Gibson, Austin, TX (US)

(73) Assignee: NXP USA, Inc., Austin, TX (US)

( * ) Notice: Subject to any disclaimer, the term of this patent is extended or adjusted under 35 U.S.C. 154(b) by 4 days.

(21) Appl. No.: 16/189,843

(22) Filed: Nov. 13, 2018

(51) Int. Cl.
H01L 21/033 (2006.01)
H01L 29/78 (2006.01)
H01L 29/06 (2006.01)
H01L 29/66 (2006.01)
H01L 21/762 (2006.01)
H01L 29/423 (2006.01)

(52) U.S. Cl.
CPC ...... H01L 29/7813 (2013.01); H01L 21/0337 (2013.01); H01L 21/76224 (2013.01); H01L 29/0634 (2013.01); H01L 29/0642 (2013.01); H01L 29/4236 (2013.01); H01L 29/66734 (2013.01); H01L 29/7811 (2013.01)

(58) Field of Classification Search
None
See application file for complete search history.

(56) References Cited

U.S. PATENT DOCUMENTS

| 4,943,408 | A |   | 7/1990 | Yamamoto et al. |
| 5,051,796 | A | * | 9/1991 | Gill ........................ H01L 27/115 257/316 |
| 5,760,444 | A | * | 6/1998 | Okumura ............ H01L 27/1203 257/350 |
| 5,874,759 | A | * | 2/1999 | Park .................. H01L 29/42324 257/314 |
| 6,084,264 | A |   | 7/2000 | Darwish |
| 6,084,265 | A |   | 7/2000 | Wu |
| 6,408,943 | B1 |  | 6/2002 | Schultz et al. |
| 6,737,675 | B2 | * | 5/2004 | Patel ..................... H01L 27/088 257/206 |

(Continued)

FOREIGN PATENT DOCUMENTS

WO 2015028838 A1 3/2015

Primary Examiner — Hrayr A Sayadian
(74) Attorney, Agent, or Firm — Mary Jo Bertani

(57) ABSTRACT

A vertical bi-directional device includes first and second conductive gates in a semiconductor layer with a first vertical gate oxide on a sidewall of the first conductive gate and a second vertical gate oxide on a sidewall of the second conductive gate. A first heavily doped region of a first conductivity type is at the surface adjacent the first conductive gate, and a second heavily doped region of the first conductivity type is at the surface adjacent to the second conductive gate. Doped regions of the first conductivity type extend below the conductive gates towards a substrate. A doped region of a second conductivity type extends laterally from the first vertical gate oxide to the second vertical gate oxide, and a heavily doped region of the second conductivity type is at the surface of the semiconductor layer, between the first and second heavily doped regions of the first conductivity type.

20 Claims, 22 Drawing Sheets

(56) References Cited

U.S. PATENT DOCUMENTS

| | | | |
|---|---|---|---|
| 6,882,011 B1* | 4/2005 | Chen | ............... H01L 27/027 |
| | | | 257/314 |
| 6,943,408 B2 | 9/2005 | Wu et al. | |
| 2003/0102564 A1 | 6/2003 | Darwish | |
| 2009/0057711 A1* | 3/2009 | Chen | ............. H01L 27/0925 |
| | | | 257/141 |
| 2010/0044795 A1* | 2/2010 | Chi | ................. H01L 21/84 |
| | | | 257/350 |

* cited by examiner

US 10,644,146 B1

VERTICAL BI-DIRECTIONAL SWITCHES AND METHOD FOR MAKING SAME

BACKGROUND

Field

This disclosure relates generally to semiconductor devices, and more specifically, to vertical bi-directional MOSFET devices and methods for making the vertical bi-directional MOSFET devices.

Related Art

Bi-directional switches switch high currents through their conduction electrodes while blocking high voltages applied to the conduction electrodes. Bi-directional switches are used in a variety of electrical systems. A typical bi-directional switch is specified to supply high currents, which may range from several Amperes of maximum current to several hundreds of Amperes depending on the specific switch and application, while blocking relatively high voltages, e.g. of at least 25 V without breaking down.

Bi-directional switches are typically implemented using electromechanical switches or a configuration of semiconductor devices, e.g. power transistors. However, standard power transistors have a low blocking voltage in one direction, making them unidirectional devices. Consequently, current bi-directional switches typically are implemented using two separate, serially coupled power metal oxide semiconductor field effect transistors (MOSFETs). The separate MOSFETs are formed on separate semiconductor dice, and often housed in separate packages, which results in a high manufacturing cost and a large area occupied on a circuit board. When the separate MOSFET dice are housed in a single package and interconnected with wire bonds, the area occupied on a circuit board is reduced but separating the body ties poses a challenge as an additional metal layer is required, which increases cost. Use of a single metal layer forces the body tie to be routed to the periphery of the device and can be several millimeters in each direction. The peripheral routing tremendously increases the resistance in the path of the body tie. Device robustness is extremely sensitive to this resistance as parasitic bipolar current can be easily triggered in a MOSFET.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of bidirectional switches and methods for making the same are disclosed herein that provide discrete vertical power metal oxide semiconductor field effect transistors (MOSFETs) with a body tie integrated within the device unit cell. Shallow trench isolation is used to separate an N+ source electrodes from the P+body tie to improve reverse breakdown voltage. The N+ source electrode and P+body tie use two different metal layers. A blanket phosphorus implant can be used after etching the isolation trenches to create a charge balance (superjunction) with an epitaxial P region for better tradeoff between breakdown voltage versus on resistance. A deep PHV implant creates an upper and lower epitaxial P layer to give the bidirectional feature to the device. A P-link implant is used to connect the P+body tie to the PHV region for increased safe operating area.

Figure 1:
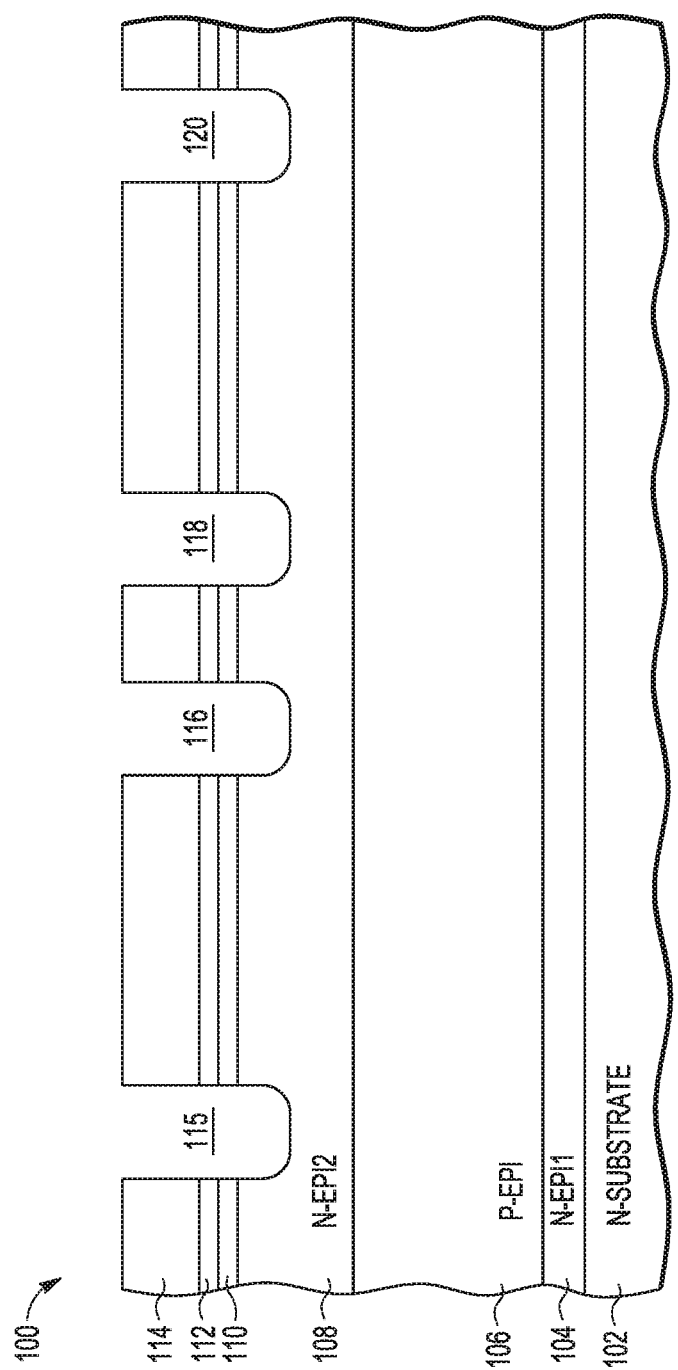
FIGS. 1-8 are side views of a bidirectional switch during successive stages of manufacture in accordance with selected embodiments of the invention.

FIGS. 1-8 are side views of a bidirectional switch 100 during successive stages of manufacture in accordance with selected embodiments of the invention. FIG. 1 shows bidirectional switch 100 at an intermediate stage of manufacture in which a first epitaxial N layer 104 has been grown on N substrate 102, an epitaxial P layer 106 has been grown on first epitaxial N layer 104, and a second epitaxial N layer 108 has been grown on epitaxial P layer 106, using conventional semiconductor manufacturing methods. A sacrificial oxide layer 110 is thermally grown on epitaxial N layer 108. A nitride layer 112 is then deposited on oxide layer 110. Photoresist layer 114 is then deposited over nitride layer 112 and patterned with openings 115, 116, 118, 120 where trenches for shallow trench isolation regions are formed in corresponding portions of nitride layer 112, oxide layer 110 and epitaxial N layer 108.

Figure 2:
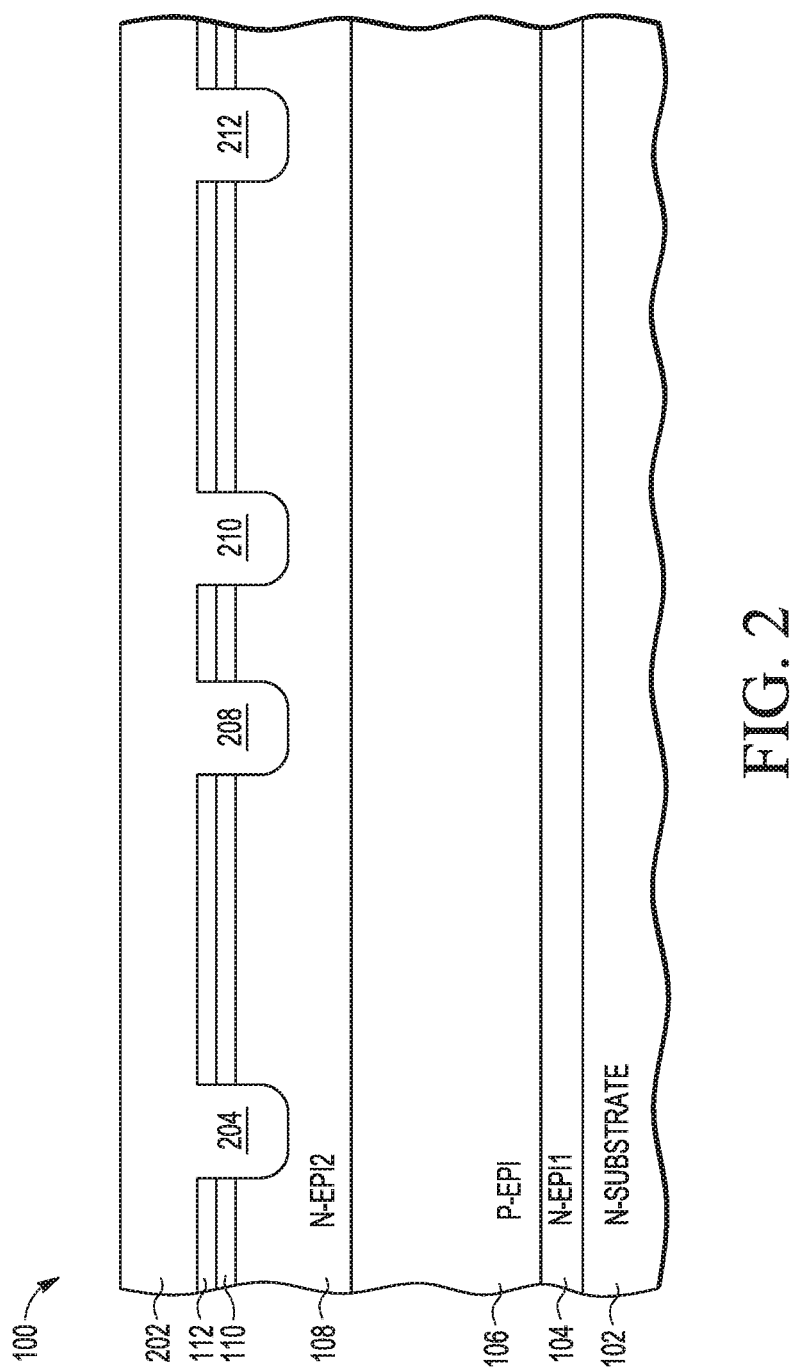

FIG. 2 shows bidirectional switch 100 of FIG. 1 at a subsequent stage of manufacture in which photoresist layer 114 has been removed using a suitable process such as ashing and/or wet chemical method. Shallow trench isolation (STI) regions 204, 208, 210, 212 have been formed by filling openings 115, 116, 118, 120 (FIG. 1) with an electrically insulating material 202 such as tetraethyl-orthosilicate (TEOS) oxide. Openings 115, 116, 118, 120 can be lined with oxide and/or nitride material (not shown) before insulating material 202 is deposited. A suitable process or combination of processes such as chemical-mechanical polishing (CMP) is then used to remove insulating material 202 outside of STI regions 204, 208, 210, 212, nitride layer 112 and oxide layer 110.

Figure 3:
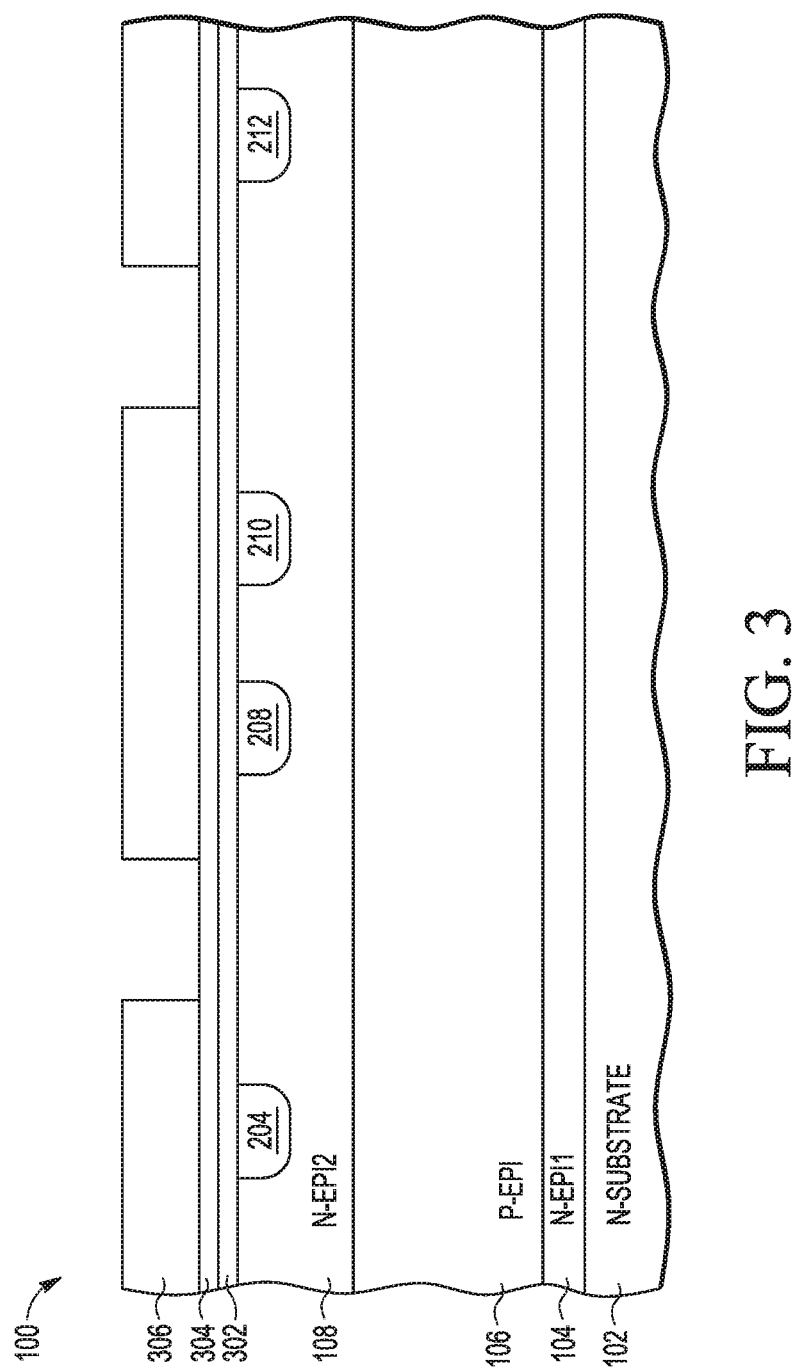

FIG. 3 shows bidirectional switch 100 of FIG. 2 at a subsequent stage of manufacture in which oxide layer 302 is then thermally grown over the top surface epitaxial layer 108 and STI regions 204, 208, 210, 212. Nitride layer 304 is deposited over oxide layer 302. Photoresist layer 306 is deposited over nitride layer 304 and patterned to cover STI regions 204, 208, 210, 212, and portions of nitride layer 208 outside STI regions 204, 208, 210, 212. Photoresist layer 306 exposes portions of nitride layer 304 in which trenches 402, 404 will be formed, as shown in FIG. 4.

Figure 4:
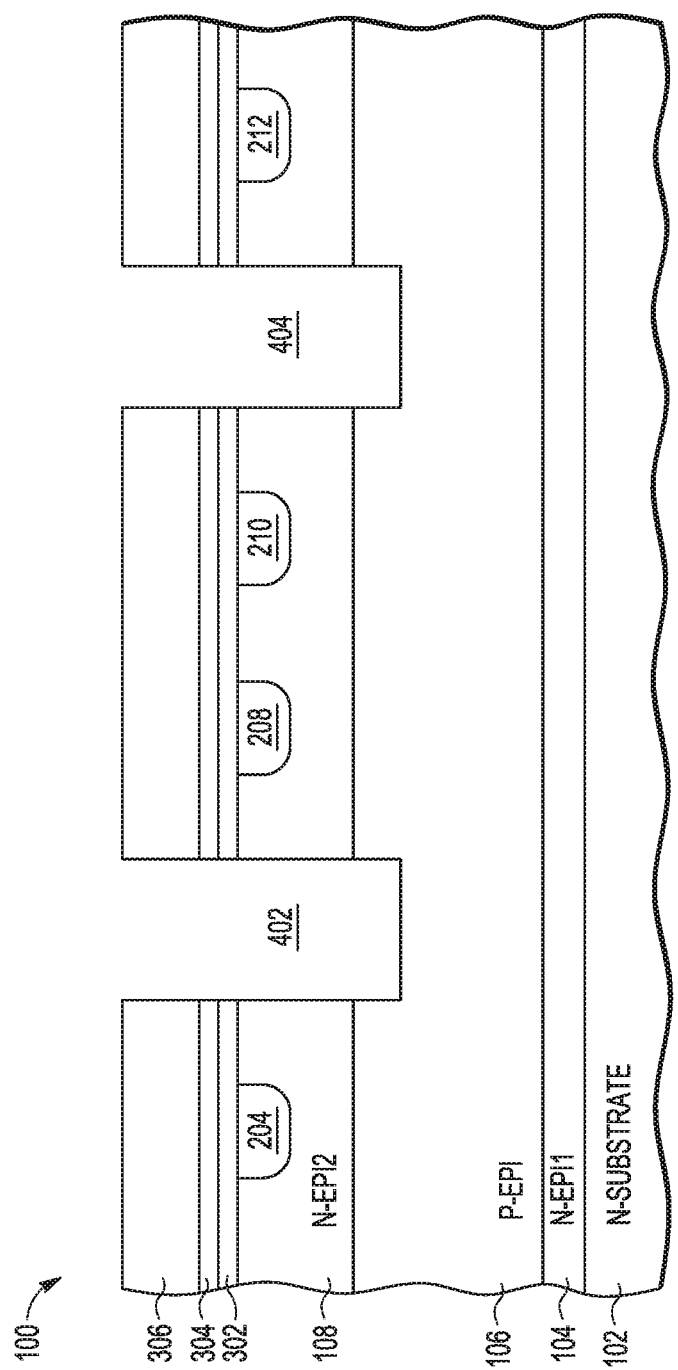

FIG. 4 shows bidirectional switch 100 of FIG. 3 at a subsequent stage of manufacture in which trenches 402, 404 have been formed by removing unmasked portions of nitride layer 304, oxide layer 302, epitaxial N layer 108 and epitaxial P layer 106.

Figure 5:
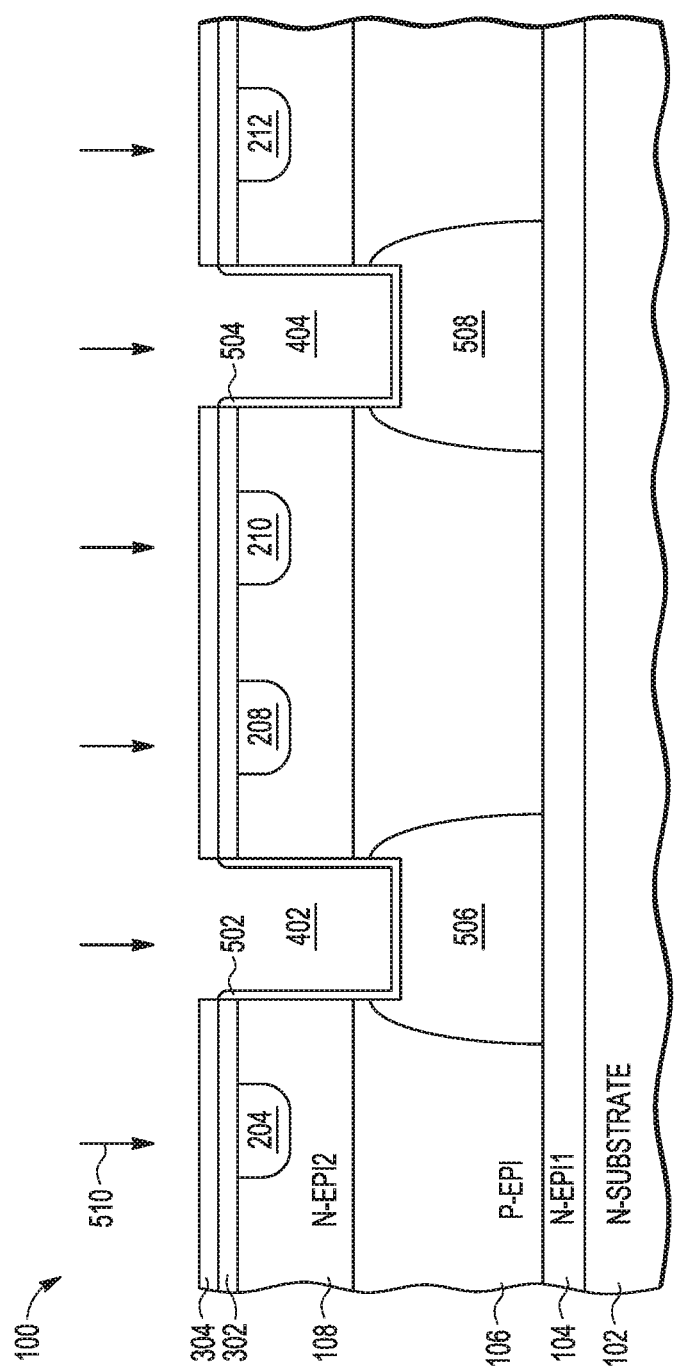

FIG. 5 shows bidirectional switch 100 of FIG. 4 at a subsequent stage of manufacture in which photoresist layer 306 has been removed and sacrificial oxide lining 502, 504 is grown on the sidewalls and bottom surface of trenches 402, 404. N-doped regions 506, 508 are implanted in epitaxial P layer 104 under and along a portion of the sidewalls of trenches 402, 404 using a blanket phosphorous implant 510 having a doping concentration, for example, of $5e^{12}$ $cm^{-3}$ at an energy of 120 to 150 KeV. In the example shown, N-doped regions 506, 508 extend through epitaxial P layer 106 from the bottom and adjacent a portion of the sidewalls of trenches 402, 404 to epitaxial N layer 104. Implant dosage and energy may be varied for better charge balance to improve breakdown voltage.

Figure 6:
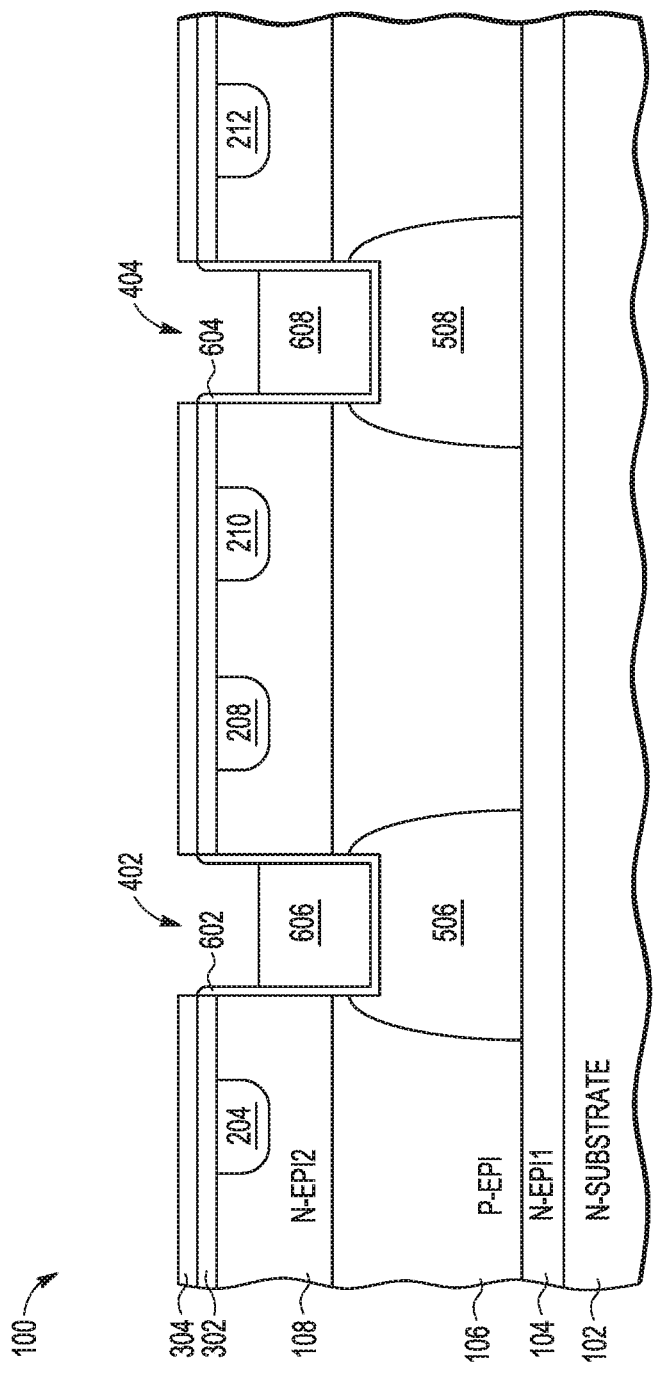

FIG. 6 shows bidirectional switch 100 of FIG. 5 at a subsequent stage of manufacture in which sacrificial oxide lining 502, 504 (FIG. 5) is removed from the sidewalls and bottom surface of trenches 402, 404 once N-doped regions 506, 508 are implanted. Gate oxide 602, 604 is grown or otherwise formed on the sidewalls and bottom of trenches 402, 404. Once gate oxide 602, 604 is grown, trenches 402, 404 are filled with polysilicon gate material 606, 608 and recess etched to leave enough space being in the upper portion of trenches 402, 404 (FIG. 6) to allow a suitable amount of insulating material (not shown) such as TEOS to be deposited on top of gate material 606, 608. In some embodiments, the remaining thickness of polysilicon gate material 606, 608 is approximately 1.5 to 2 micrometers depending on the depth of trenches 402, 404, however, other suitable thicknesses can be used. Polysilicon gate material 606, 608 may be doped with arsenic.

Figure 7:
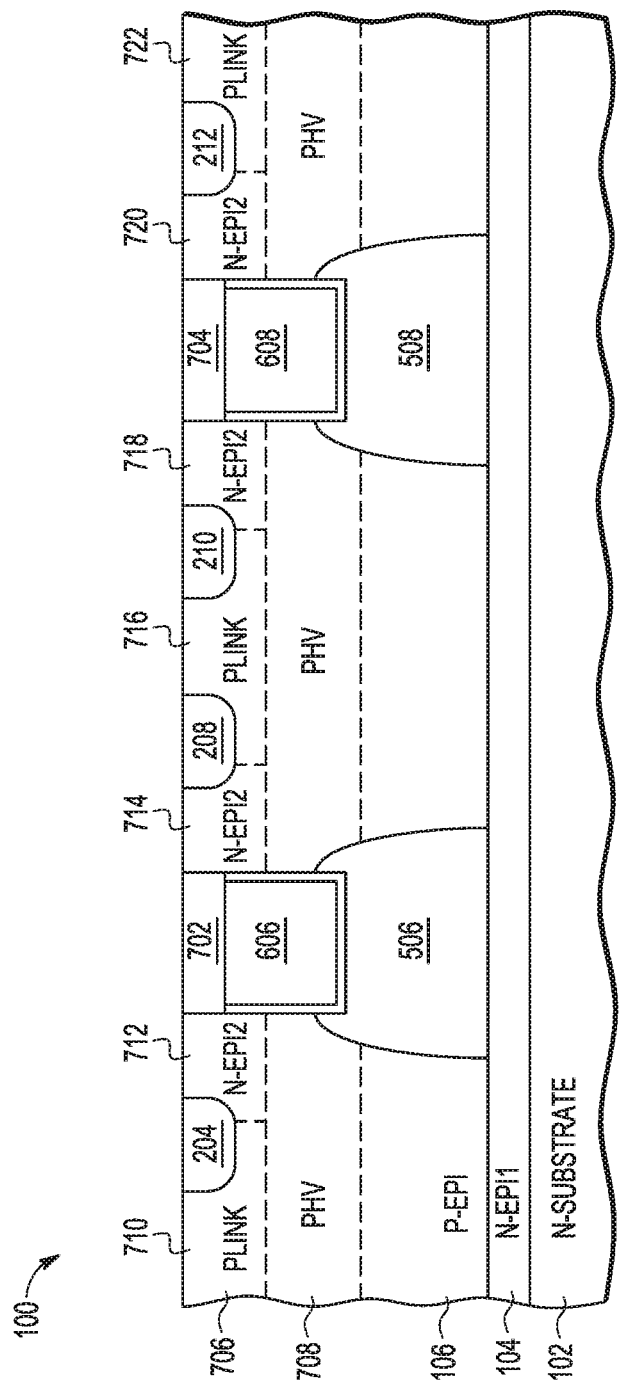

FIG. 7 shows bidirectional switch 100 of FIG. 6 at a subsequent stage of manufacture in which insulating material 702, 704 such as TEOS has been deposited on top of gate material 606, 608 and chemical-mechanical polishing (CMP) and/or etching has been used to remove any excess insulating material 702, 704 along with nitride layer 304 and oxide layer 302 (FIG. 6), thereby exposing STI regions 204-212 and epitaxial N layer 108 (FIG. 6).

Epitaxial N layer 108 (FIG. 6) is then masked with patterned photoresist (not shown) and implanted with boron or other P-type material to create PHV layer 708 in the upper portion of epitaxial P layer 106 under epitaxial N layer 108. PHV layer 708 is continuous except for an upper portion of N-doped regions 506, 508 and a lower portion of polysilicon material 606, 608 and gate oxide 602, 604 extending through respective portions of PHV layer 708.

Epitaxial N layer 108 (FIG. 6) is then masked again with patterned photoresist (not shown) and implanted with boron or other P-type material to create P-link regions 710 adjacent to one side and under a portion of STI region 204; P-link region 716 adjacent to, between, and under respective portions of STI regions 208, 210; and P-link region 722 adjacent to one side and under a portion of STI region 212.

After P-link regions 710, 716, 722 are formed, epitaxial N regions 712, 714, 718, 720 remain from epitaxial N layer 108 (FIG. 6). Epitaxial N region 712 is between STI region 204 and the combination of gate material 606/insulating material 702, and partially under STI region 204. Epitaxial N region 714 is between the combination of gate material 606/insulating material 702 and STI region 208, and partially under STI region 208. Epitaxial N region 718 is between STI region 210 and the combination of gate material 608/insulating material 704, and partially under STI region 210. Epitaxial N region 720 is between the combination of gate material 608/insulating material 704 and STI region 212, and partially under STI region 212.

Figure 8:
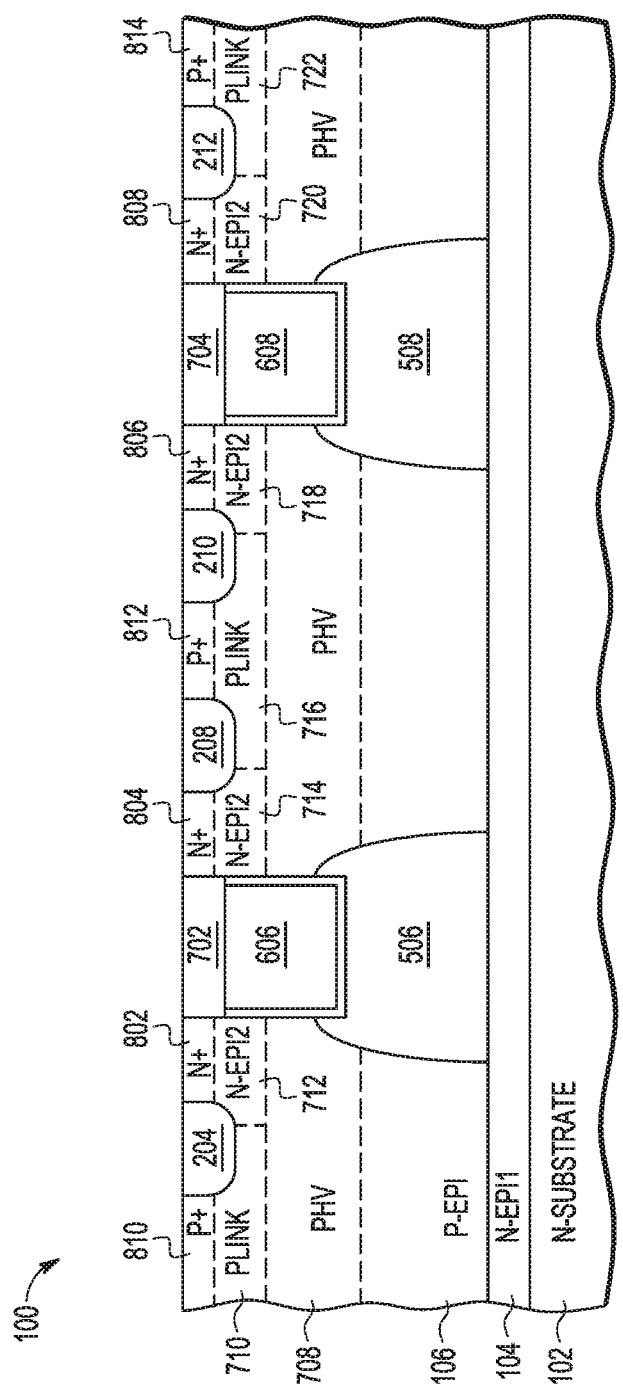

FIG. 8 shows bidirectional switch 100 of FIG. 7 at a subsequent stage of manufacture in which N+ regions 802, 804, 806, 808 and P+ regions 810, 812, 814 are formed using respective N and P type doping materials such as phosphorous and boron. N+ region 802 is formed in epitaxial N region 712 between STI region 204 and insulating material 702. N+ region 804 is formed in epitaxial N region 714 between insulating material 702 and STI region 208. N+ region 806 is formed in epitaxial N region 718 between STI region 210 and insulating material 704. N+ region 808 is formed in epitaxial N region 720 between insulating material 704 and STI region 212.

P+ region 810 is formed in P-link region 710 adjacent STI region 204. P+ region 812 is formed in P-link region 716 between STI regions 208, 210. P+ region 814 is formed in P-link region 722 adjacent STI region 212. In some embodiments, the doping concentration of P+ regions 810, 812, 814 is higher than respective P-link regions 710, 716, 722, and the doping concentration of PHV regions 708 is higher than P-link regions 710, 716, 722. Electrically conductive contacts (not shown) can be formed in contact with respective N+ regions 802, 804, 806, 808, and P+ regions 810, 812, 814.

P+ region 812, P-link region 716, and PHV region 708 and P Epi region 106 below P-link region 812 form a body tie that is integrated within device 100 with shallow trench isolation regions 208, 210 separating N+ regions 804, 806 from the body tie. STI regions 208, 210 between N+ regions 804, 806 and the body tie improves reverse breakdown voltage. P-link region 716 connects P+ region 812 to PHV region 708 to improve the safe operating area while the deep PHV region 706 below P-link region 716 creates an upper and lower epitaxial region to provide the bidirectional capability.

Figure 9:
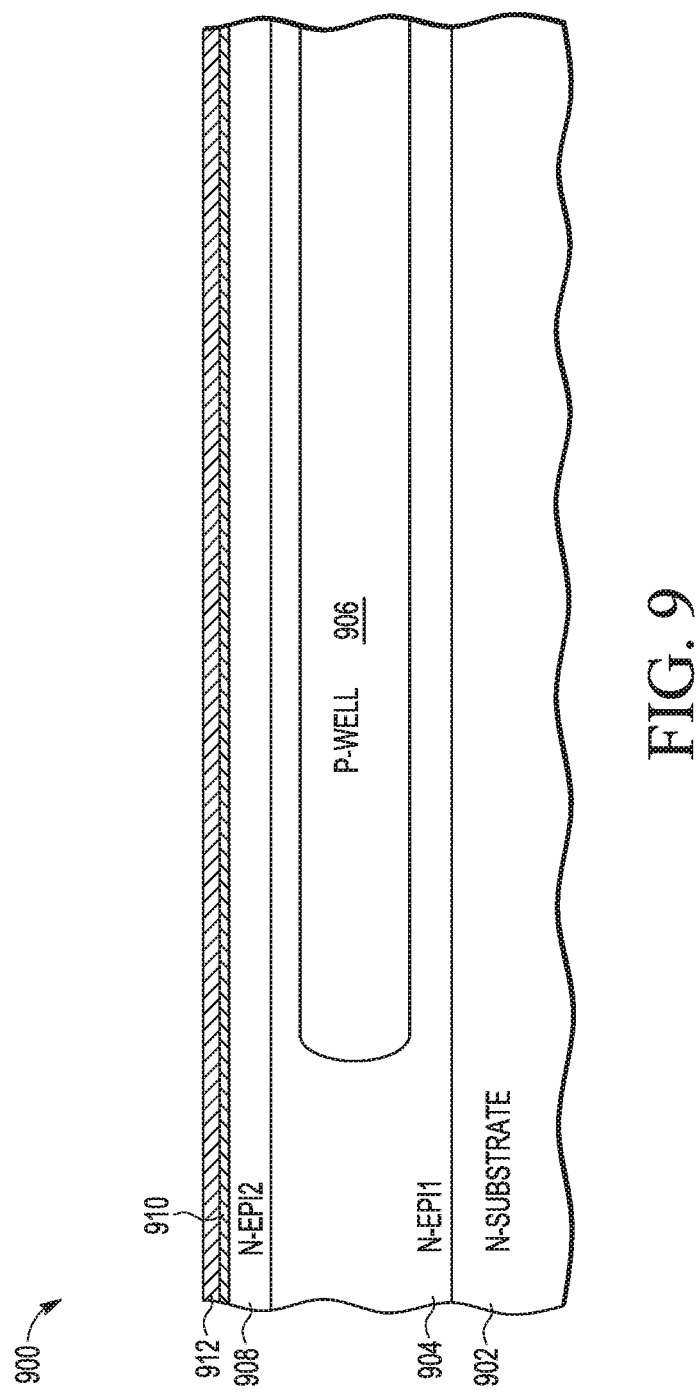
FIGS. 9-22 are side views of a bidirectional switch during successive stages of manufacture in accordance with other selected embodiments of the invention.

FIGS. 9-24 are side views of a bidirectional switch 900 during successive stages of manufacture in accordance with other selected embodiments of the invention. FIG. 9 shows bidirectional switch 900 at an intermediate stage of manufacture in which epitaxial N layer 904 has been grown on N substrate 902 using conventional semiconductor manufacturing methods. Epitaxial N layer 904 is grown over N substrate 902. P-well 906 is then implanted in a portion of epitaxial N layer 904. A second epitaxial N layer 908 is grown over P-well 906 and the portion of epitaxial N layer 904 that has not been implanted with P-well-906. An oxide layer 910 is thermally grown on epitaxial N layer 908. A nitride layer 912 is then deposited on oxide layer 912.

Figure 10:
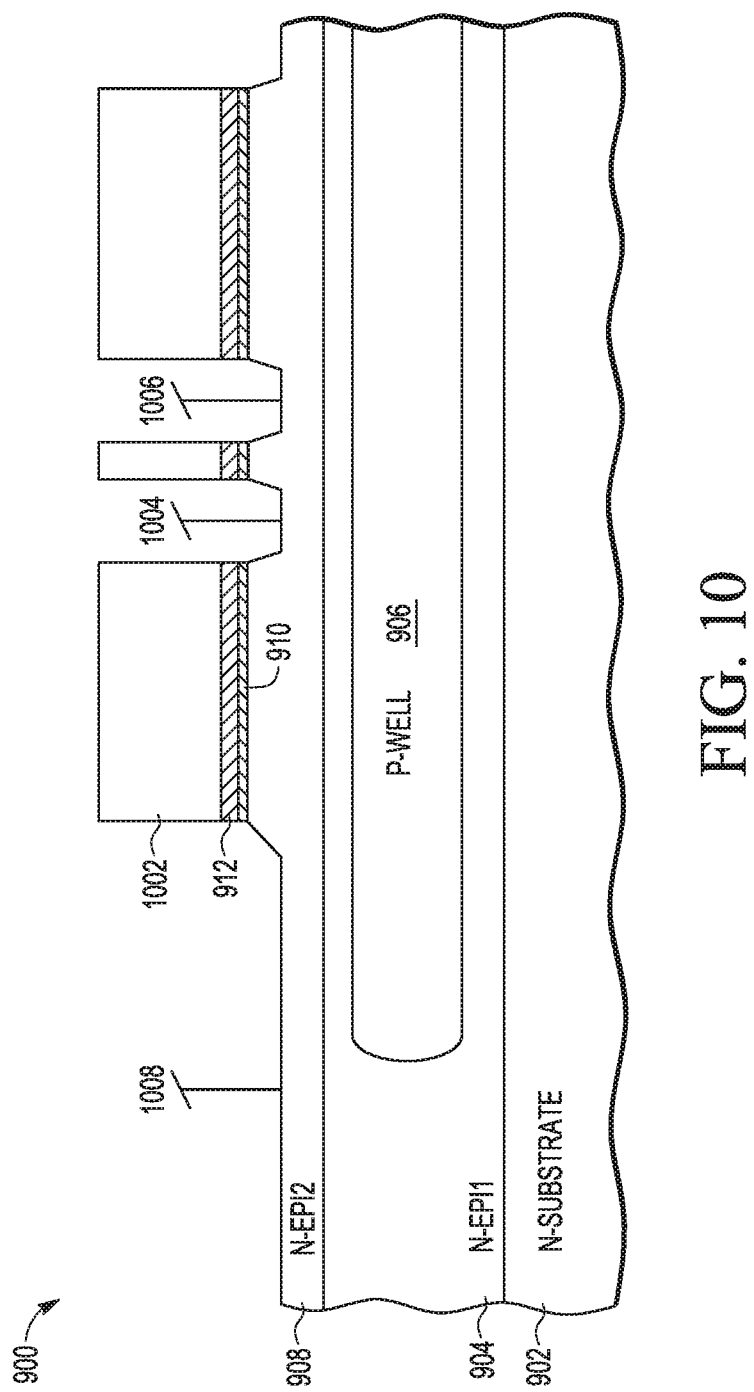

FIG. 10 shows bidirectional switch 900 of FIG. 9 at a successive intermediate stage of manufacture in which a patterned photoresist layer 1002 has been formed over nitride layer 912. Photoresist layer 1002 includes openings where trenches or recesses 1004, 1006 for shallow trench isolation (STI) regions are formed in corresponding portions of epitaxial N layer 908. Photoresist layer 1002 masks portions of nitride layer 908 in which components such as control gate electrodes and source/drain electrodes for semiconductor devices such as transistors will be formed in underlying layers 904, 906, 908. In the example shown, photoresist layer 1002 is patterned so that a section of nitride layer adjacent one of the masked portions was not masked, allowing recess 1008 to be formed in epitaxial N layer 908.

Figure 11:
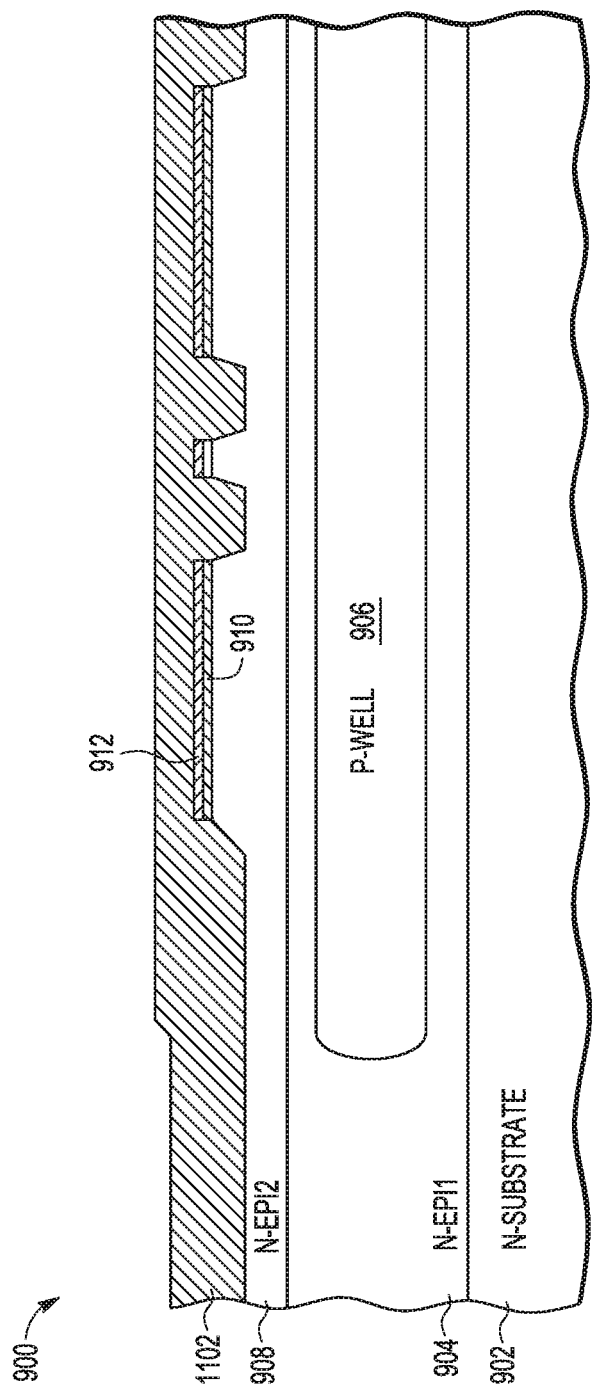

FIG. 11 shows bidirectional switch 900 of FIG. 10 at a successive intermediate stage of manufacture in which photoresist layer 1002 (FIG. 10) is removed and trenches 1004, 1006 for STI regions can be lined with oxide and/or nitride material (not shown). A layer of electrically insulating material 1102 such as tetraethyl-orthosilicate (TEOS) oxide is then deposited over the exposed portions of N epitaxial layer 908 and nitride layer 912. In some embodiments, insulating material 1102 is conformally deposited approximately 7.5 kilo Angstroms thick and densified at 1000 degrees Celsius. Other suitable thickness and densifications can be used for insulating material 1102, and suitable materials other than TEOS can also be used.

Figure 12:
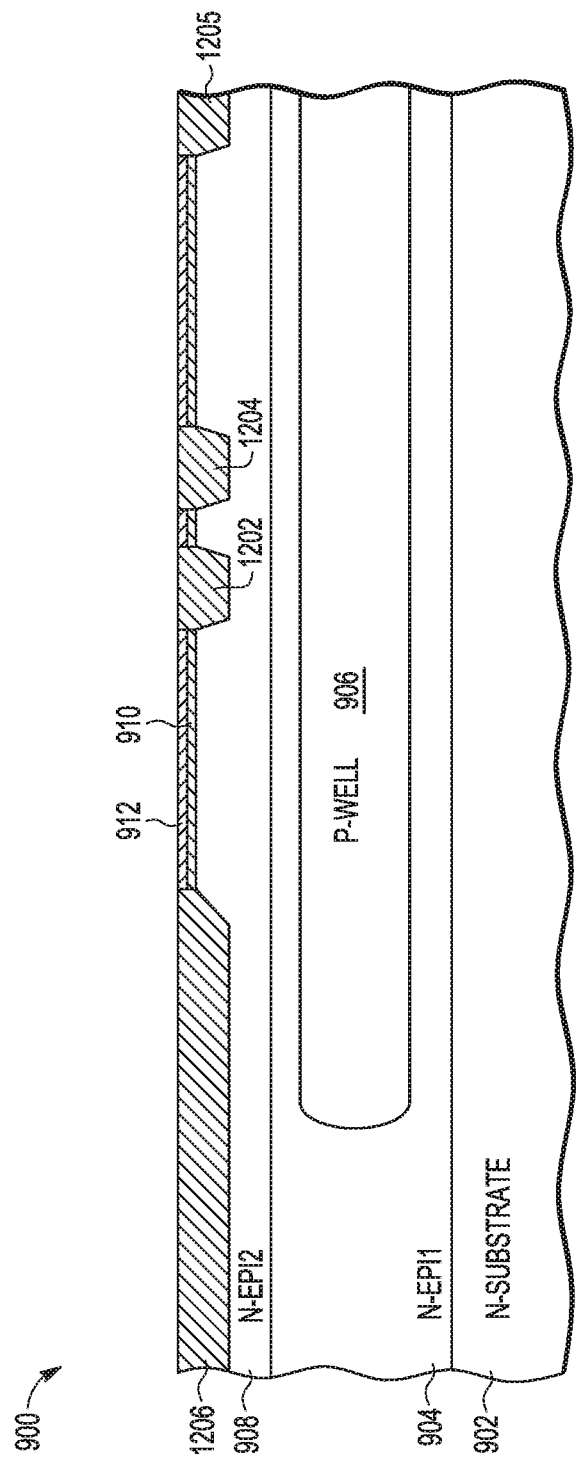

FIG. 12 shows bidirectional switch 900 of FIG. 11 at a successive intermediate stage of manufacture in which excess insulating material 1102 is removed down to nitride layer 912 using a suitable process such as chemical-mechanical polishing or other suitable technique. Once excess insulating material 1102 is removed, STI regions 1202, 1204, 1205, and insulated region 1206 remain adjacent respective portions of oxide layer 910 and nitride layer 912.

Figure 13:
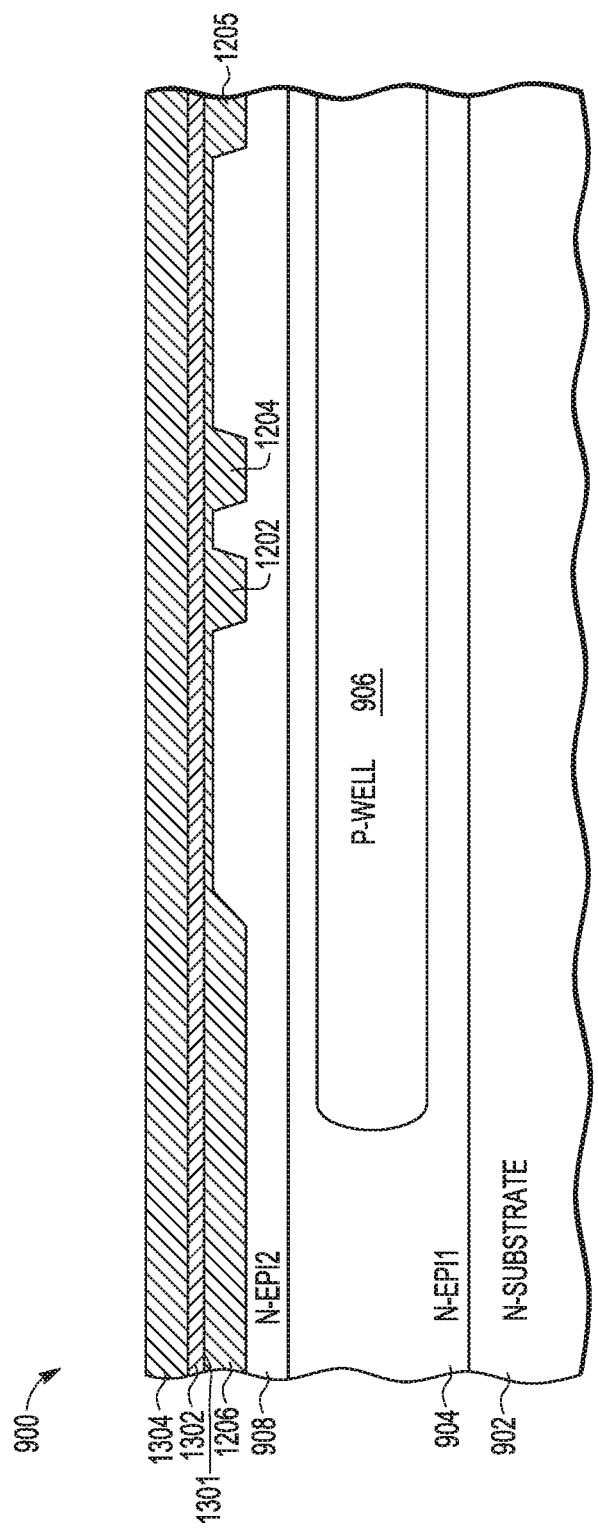

FIG. 13 shows bidirectional switch 900 of FIG. 12 at a successive intermediate stage of manufacture in which oxide layer 1301 is thermally grown over the top surface insulating material in insulated region 1206, STI regions 1202, 1204, 1205, portions of epitaxial N layer 908 between insulated region 1206 and STI region 1202, and adjacent STI region 1204. Nitride layer 1302 is deposited over oxide layer 1301. Hard mask layer 1304 is then deposited over nitride layer 1302. Hard mask layer 1304 can be formed of TEOS or other suitable material and should be thick enough to completely or at least substantially block a subsequent implant with an N-type material such as phosphorous.

Figure 14:
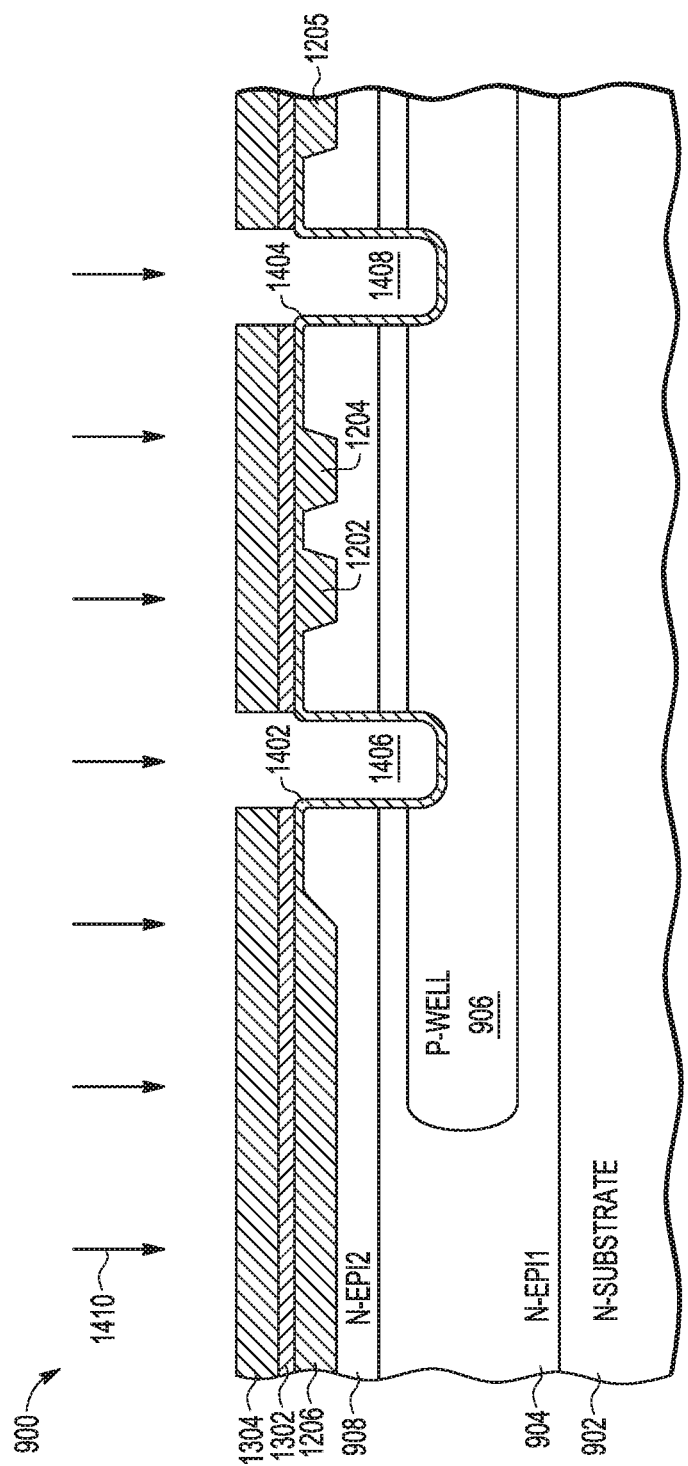
Figure 15:
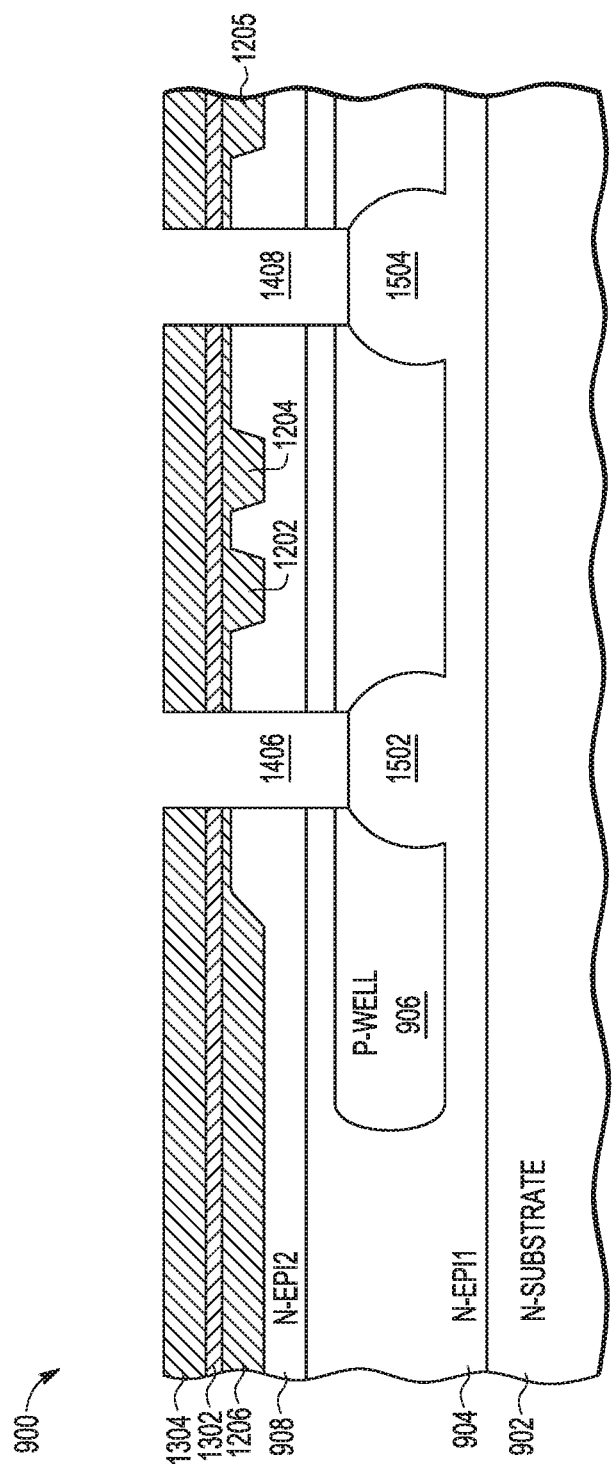

FIG. 14 shows bidirectional switch 900 of FIG. 13 at a successive intermediate stage of manufacture in which a photoresist or masking layer (not shown) is deposited over hard mask layer 1304 and patterned to expose portions of nitride layer 1302 in which trenches 1406, 1408 are formed by etching or removing unmasked portions of nitride layer 804, oxide layer, 802 and deep P-well 708 to a specified depth above epitaxial N layer 702. Sacrificial gate oxide lining 1402, 1404 is then thermally grown or deposited along the bottom and sidewall of trenches 1406, 1408. An N-type material is then implanted 1410 through trenches 1406, 1408 to form N-doped regions 1502, 1504 in P-well 906, as shown in FIG. 15. N-doped regions 1502, 1504 extend through P-well 906 and are in direct contact with epitaxial N layer 904.

N-doped regions 1502, 1504 are implanted in P-well 906 under and along a portion of the sidewalls of trenches 1406, 1408 using a blanket phosphorous implant with a doping concentration, for example, of $5e^{12}$ cm$^{-3}$ at an energy of 120 to 150 KeV. In the example shown, N-doped regions 1502, 1504 extend through P-well 906 from the bottom and adjacent a portion of the sidewalls of trenches 1406, 1408 to epitaxial N layer 702. Implant dosage and energy may be varied for better charge balance to improve breakdown voltage. Sacrificial oxide lining is then removed from the sidewalls and bottom surface of trenches 1406, 1408 once N-doped regions 1502, 1504 are implanted.

Figure 16:
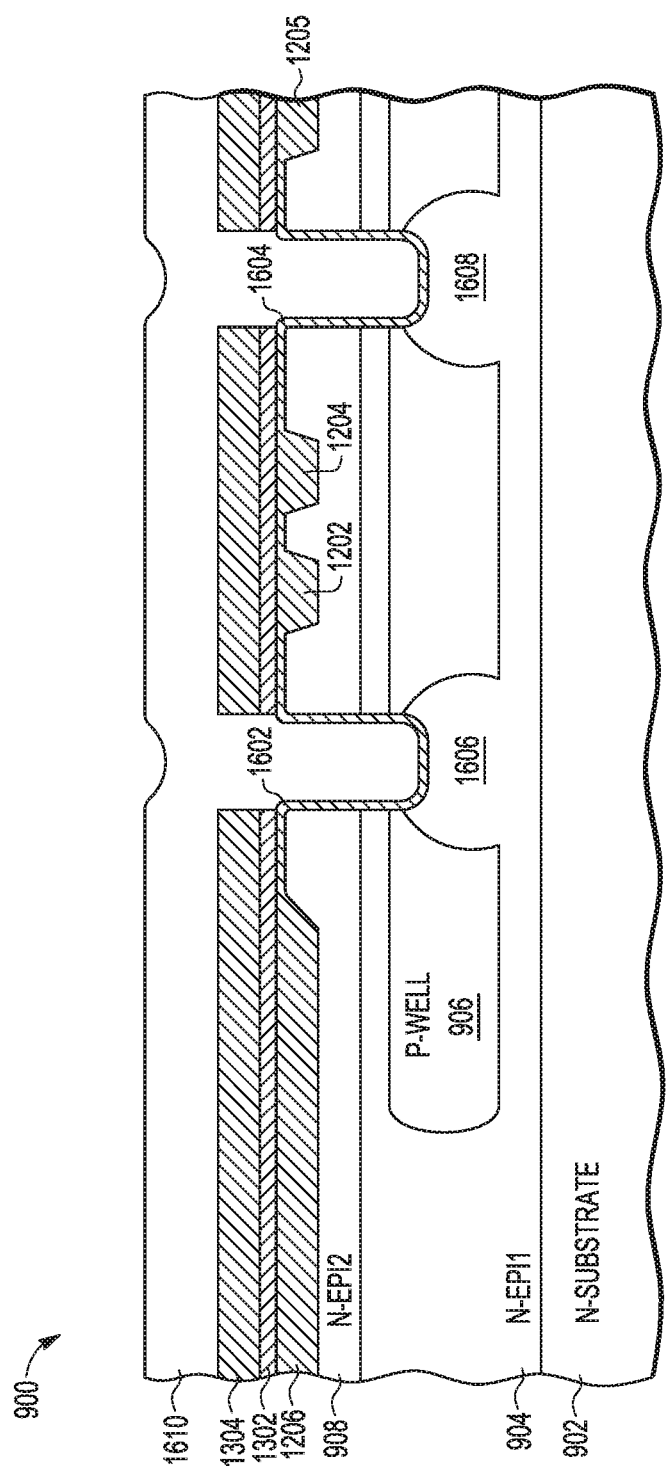

FIG. 16 shows bidirectional switch 900 of FIG. 15 at a successive intermediate stage of manufacture in which gate oxide 1602, 1604 is grown on the sidewalls and bottom of trenches 1406, 1408. Once gate oxide 1602, 1604 is grown, polysilicon gate material 1610 is deposited in trenches 1406, 1408. Once deposited, polysilicon gate material 1610 may be doped with arsenic.

In other embodiments, a deeper layer of oxide can be used at the bottom of trenches 1406, 1408 than on the sidewalls of trenches 1406, 1408. In still further embodiments, trenches 1406, 1408 can be formed to extend to the top surface of substrate 102 and a shield polysilicon electrode (not shown) can be formed below polysilicon gate material 1610. The shield polysilicon electrode would be separated from polysilicon gate material 1610 by oxide material.

Figure 17:
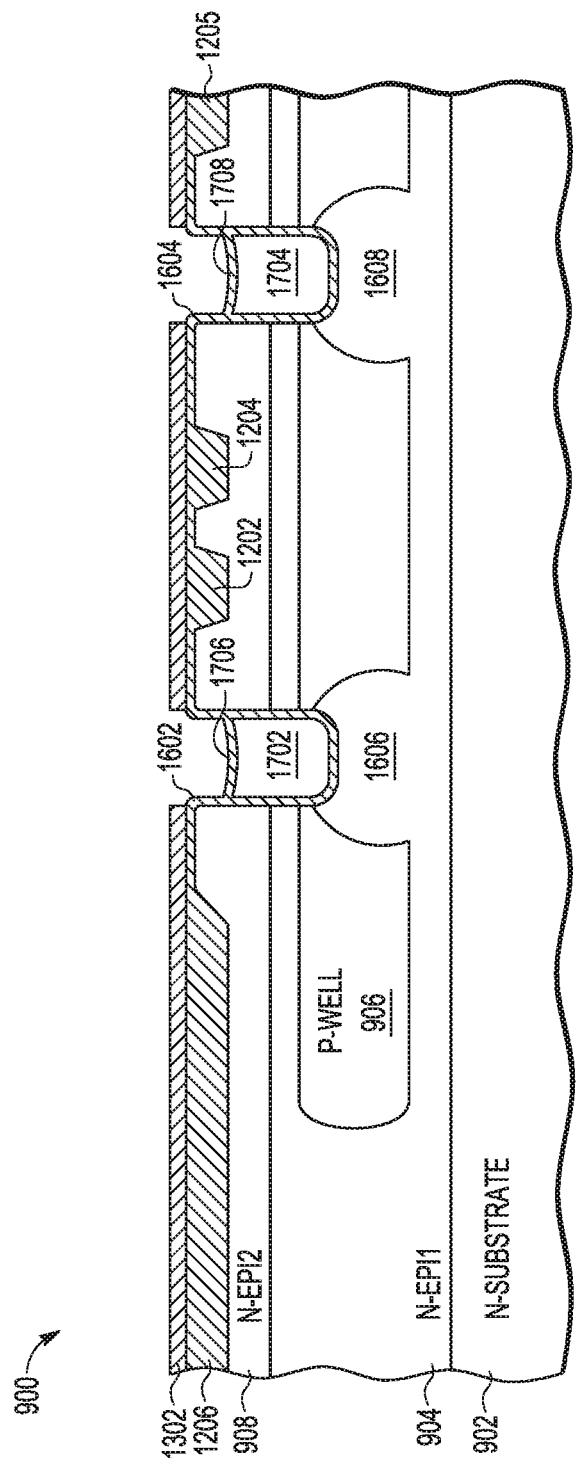

Once polysilicon gate material 1610 is deposited and doped, chemical-mechanical polishing (CMP) can be used to remove polysilicon material 1610 that is above trenches 1406, 1408, and masking layer 1304, down to the level of nitride layer 1302 as shown in FIG. 17. Polysilicon gate material 1610 (FIG. 16) is then recess etched below the top surface of epitaxial N layer 908 to create polysilicon gate portions 1702, 1704. In some embodiments, the thickness of polysilicon gate portions 1702, 1704 is approximately 1.5 to 2 micrometers depending on the depth of trenches 1406, 1408, however, other suitable thicknesses of polysilicon gate portions 1702, 1704 can be used. A layer of thermal oxide 1706, 1708 can then be grown on polysilicon gate portions 1702, 1704.

Figure 18:
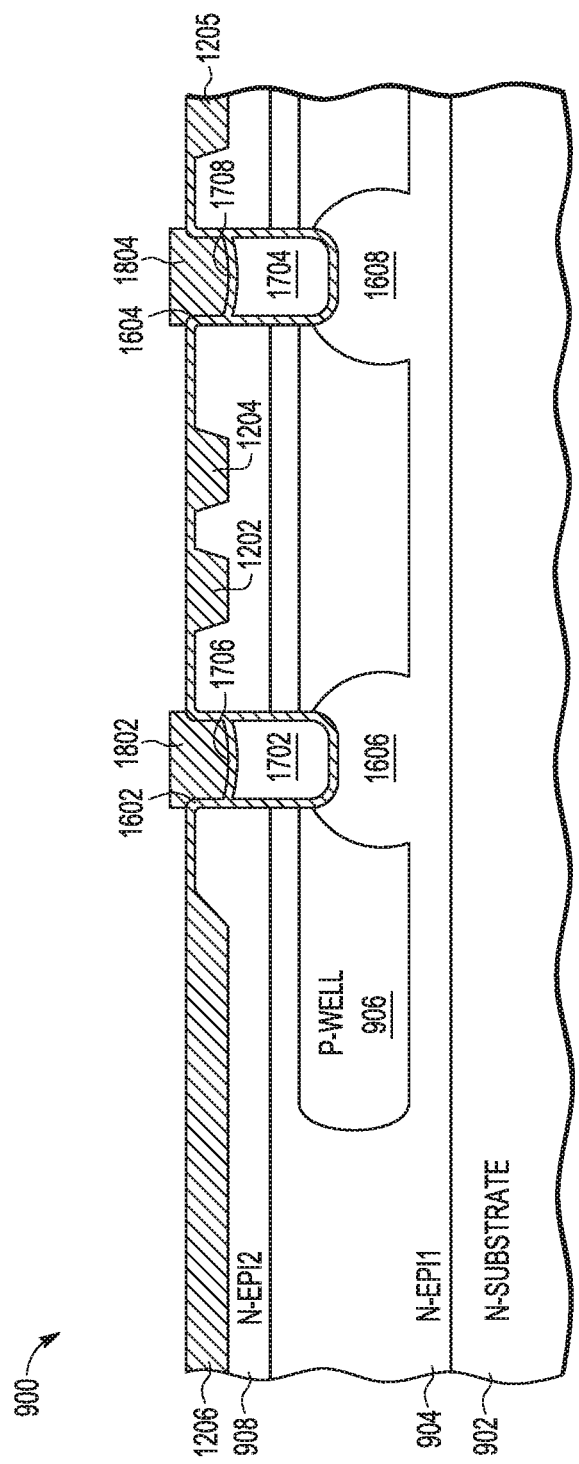

FIG. 18 shows bidirectional switch 900 of FIG. 17 at a successive intermediate stage of manufacture in which the upper portion of trenches 1406, 1408 (FIG. 14) are filled with an electrically insulating material 1802, 1804 such as tetraethyl-orthosilicate (TEOS) oxide. Once insulating material 1802, 1804 is deposited, nitride layer 1302 is removed using, for example, a hot phosphoric acid etch.

Figure 19:
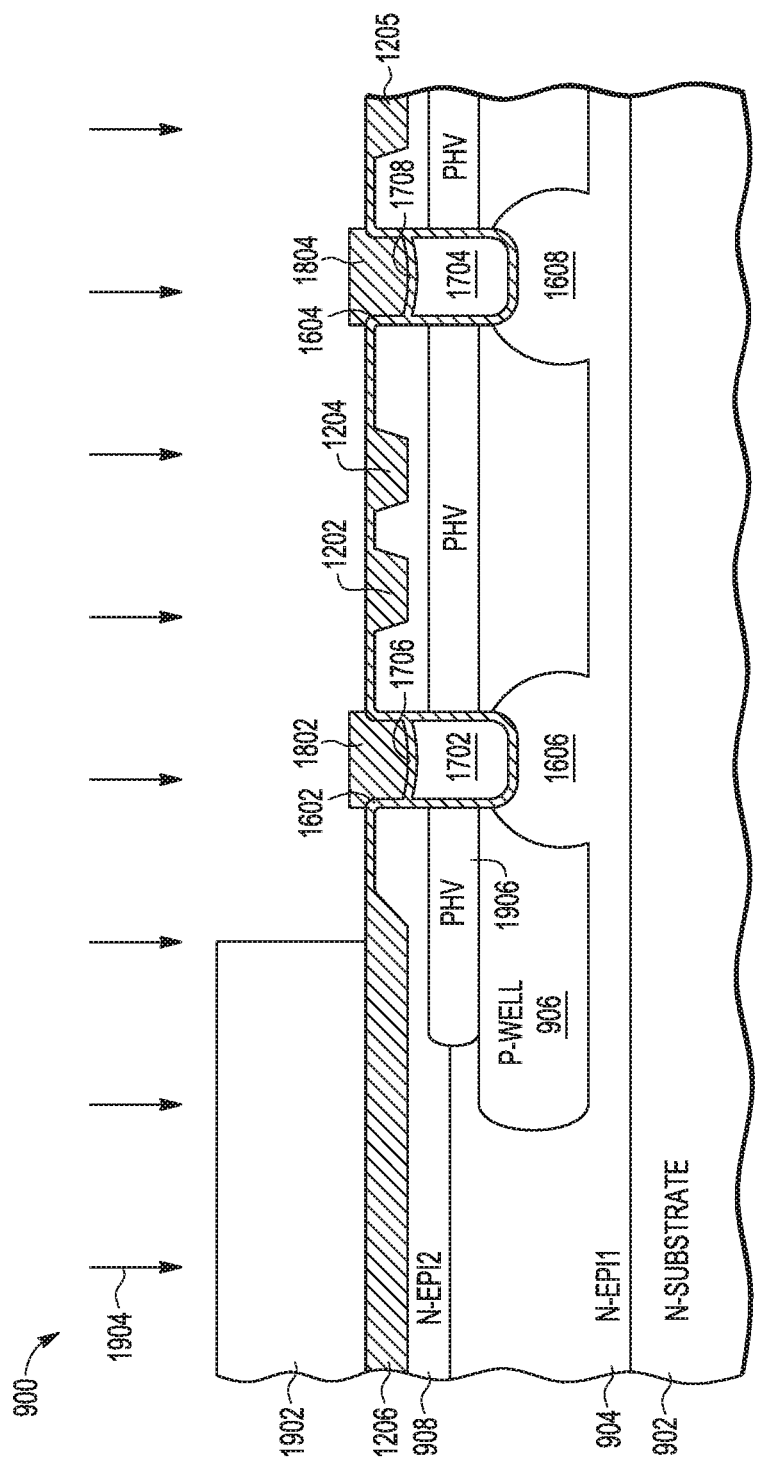

FIG. 19 shows bidirectional switch 900 of FIG. 18 at a successive intermediate stage of manufacture in which a patterned photoresist layer 1902 is deposited over a portion of oxide layer 1206 in recess 1008 (FIG. 10) of epitaxial N layer 908. PHV region 1906 is formed over P-well 906 in epitaxial N layers 904, 908 by implanting a suitable doping material 1904 such as boron in unmasked regions using a doping concentration, for example, of 1.2 to 1.5 $e^{13}$ atoms/square centimeter of boron at an energy of 1100 electron Volts. Other suitable doping concentrations and implant energies can be used. PHV region 1906 is thus formed on both sides of trenches 1406, 1408 (FIG. 14) and continuously under STI regions 1202, 1204 between trenches 1406, 1408. PHV region 1906 is also in contact with the upper portion of P-well 906.

Figure 20:
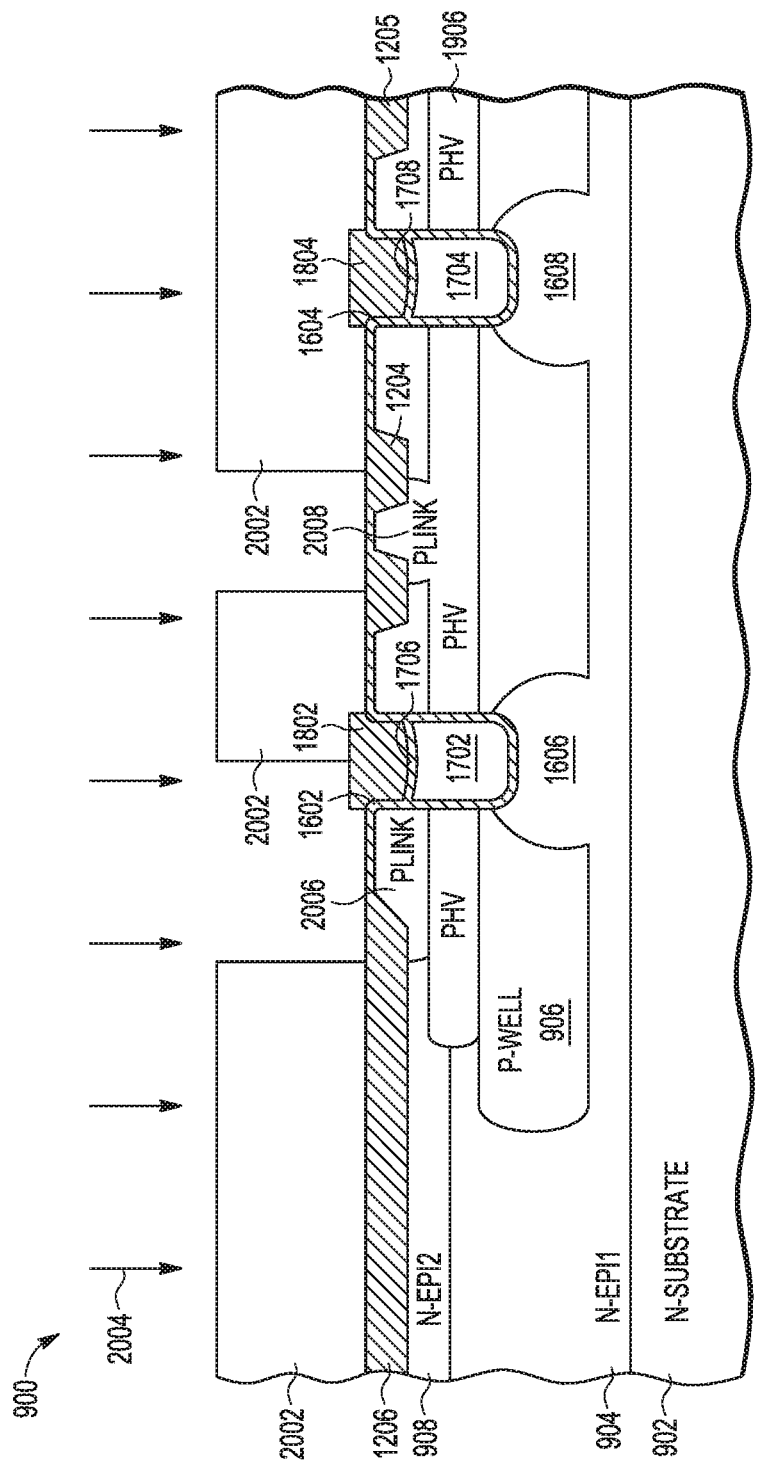

FIG. 20 shows bidirectional switch 900 of FIG. 19 at a subsequent stage of manufacture in which a patterned photoresist mask 2002 is formed over a portion of recess 1008 (FIG. 10) of epitaxial N layer 908. Another section of mask 2002 is patterned to extend between an intermediate portion of insulating material 1802 and an intermediate portion of STI region 1202. Another section of mask 2002 is patterned to extend between an intermediate portion of STI region 1204 and an intermediate portion of STI region 1210. P-link regions 2006, 2008 can be formed in epitaxial N layer 908 by multiple chain implants 2004 using a suitable doping material such as boron in the unmasked region between STI regions 1202, 1204. P-link regions 2006, 2008 can be formed using any suitable doping concentrations and implant energies.

Figure 21:
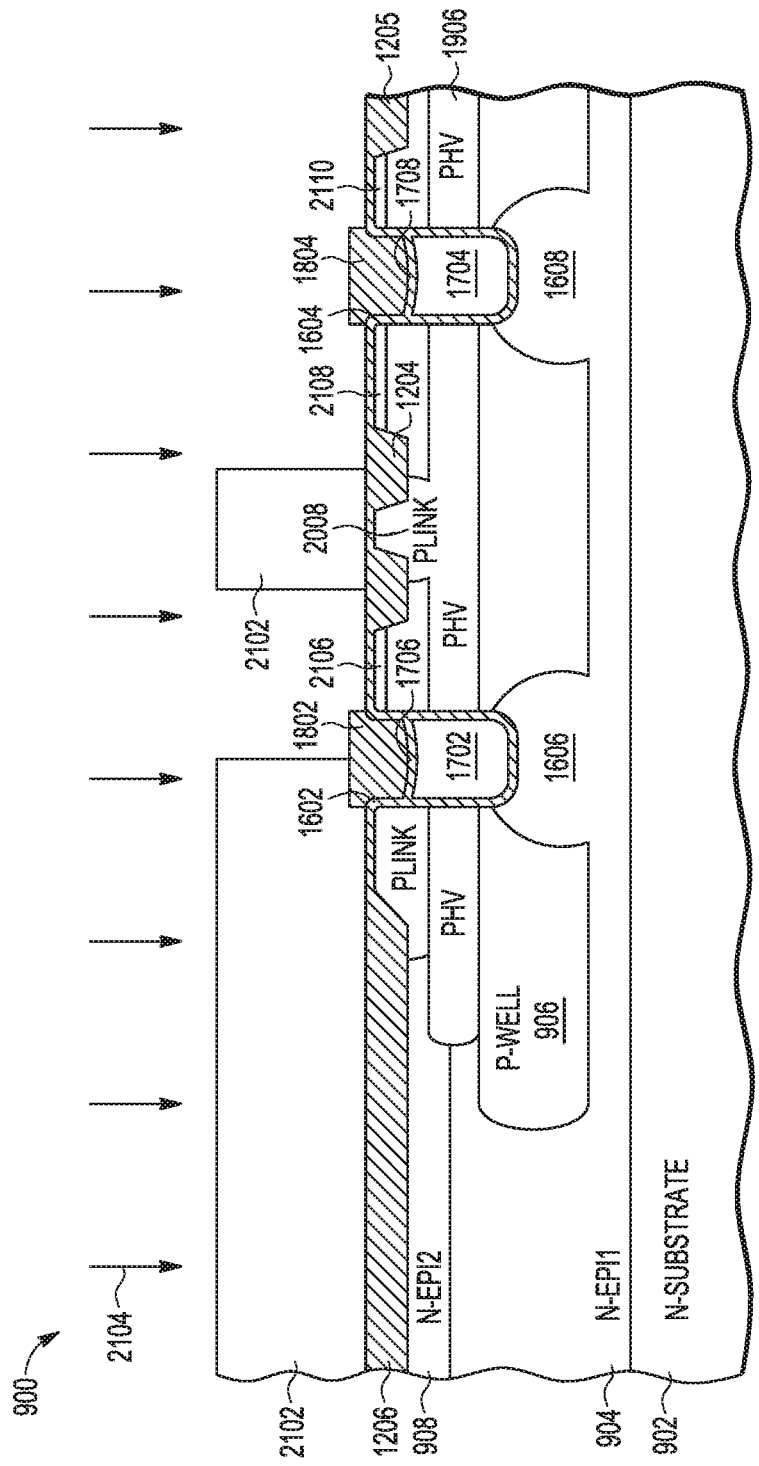

FIG. 21 shows bidirectional switch 900 of FIG. 20 at a subsequent stage of manufacture in which N+ regions 2106, 2108, 2110 are formed between STI regions 1202, 1204, 1205 and respective trenches 1406, 1408. A patterned photoresist mask 2102 is formed over recess 1008 (FIG. 10) of epitaxial N layer 908 and extends continuously over an intermediate portion of insulating material 1802. Another section of mask 2102 is patterned to extend between an intermediate portion of STI region 1202 and an intermediate portion of STI region 1204. N+ regions 2106, 2108, 2110 can be formed in upper portions of unmasked regions of epitaxial N layer 908 by implanting material 2104 with a doping concentration of, for example, of 1.5$e^{20}$ atoms/cubic centimeter of phosphorous at an energy of 25 kilo electron Volts. Other suitable doping concentrations and implant energies can be used. N+ regions 2106, 2108, 2110 form current electrode contacts for bidirectional switch 900.

Figure 22:
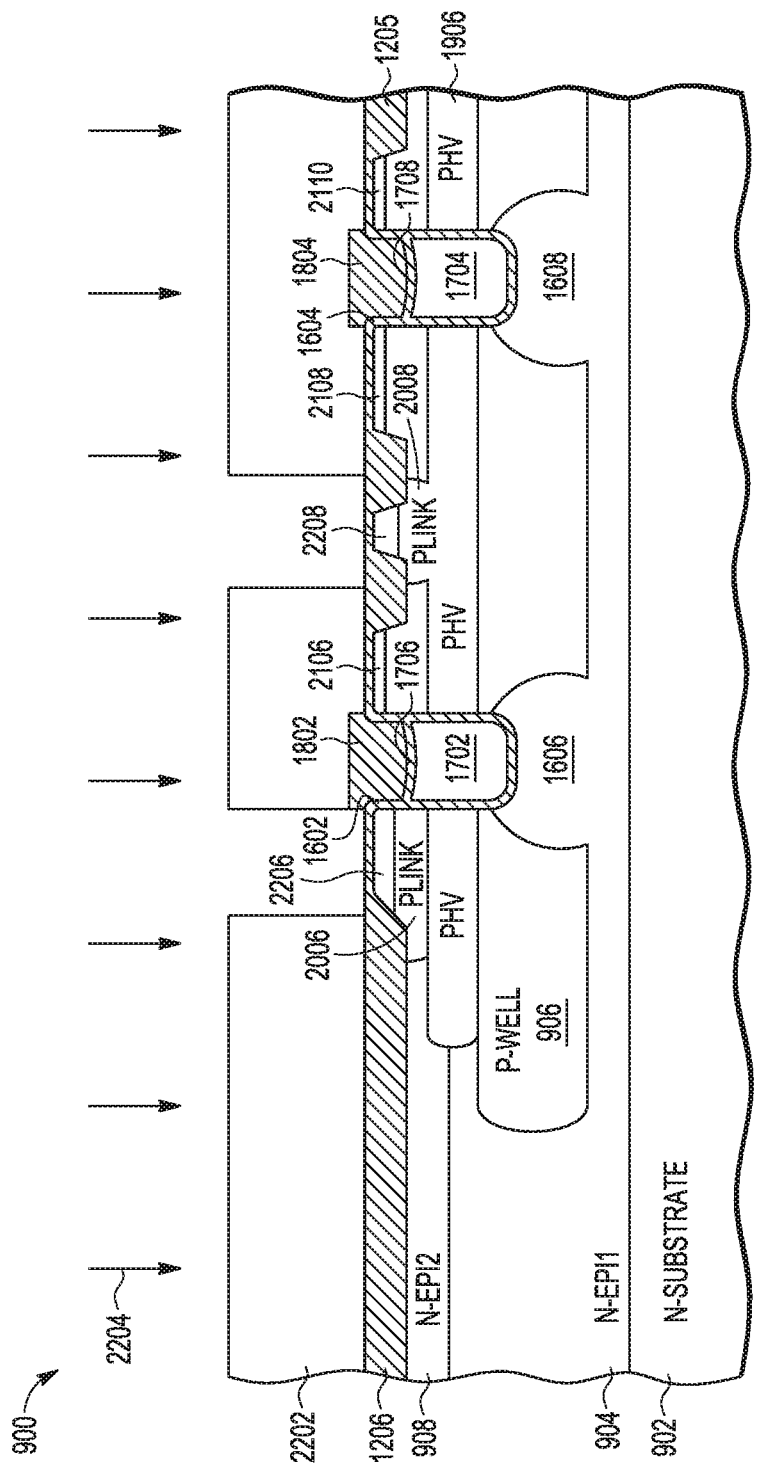

Referring to FIG. 22, bidirectional switch 900 of FIG. 21 is shown at a subsequent stage of manufacture in which a patterned mask 2202 is formed with a first portion that extends over oxide 1206 in recess 1008 (FIG. 10), a second portion that covers insulating material 1802 and extends to an intermediate portion of STI region 1202 (FIG. 19), and a third portion that extends from an intermediate portion of STI region 1204 (FIG. 19) to STI region 1205. Mask 2202 thus includes an opening between the intermediate portions of STI regions 1202, 1204 over P-link regions 2006, 2008 to form respective P+ regions 2206, 2208 in the upper portions of P-link regions 2006, 2008 by implanting a suitable doping material such as boron in the unmasked region between STI regions 1202, 1204. In some embodiments, the doping concentration of P+ regions 2206, 2208 is higher than P-link regions 2006, 2008, and the doping concentration of PHV region 1906 is higher than P-link region 2008. An electrically conductive contact can be formed in contact with P+ region 2206.

In other embodiments, N+ regions 2106, 2108, 2110 can be formed before P-link regions 2006, 2008 and/or P+ regions 2206, 2208.

P+ region 2206, P-link region 2008, PHV region 1906 and P-well 906 form a body tie that is integrated within device 900 with shallow trench isolation regions 1202, 1204 separating N+ regions 2106, 2108 from the body tie. STI regions 1202, 1204 between N+ regions 2106, 2108 and the body tie improves reverse breakdown voltage. P-link region 2008 connects P+ region 2206 to PHV region 1906 to improve the safe operating area while the PHV region 1906 creates an upper and lower epitaxial region to provide the bidirectional capability.

The semiconductor substrate described herein can be any semiconductor material or combinations of materials, such as gallium arsenide, silicon germanium, silicon-on-insulator (SOI), silicon, monocrystalline silicon, the like, and combinations of the above.

It can now be appreciated that in some embodiments, a vertical bi-directional device can comprise a substrate (102, 902), a semiconductor layer (104, 106, 108 or 904, 908) over the substrate, a first conductive gate (606, 1702) in the semiconductor layer, recessed from a top surface of the semiconductor layer, a first gate oxide (602, 1602) on a first sidewall and a bottom surface of the first conductive gate, wherein the first sidewall of the first conductive gate is perpendicular to a major surface of the substrate, a second conductive gate (608, 1704) in the semiconductor layer, recessed from the top surface of the semiconductor layer, a second gate oxide (604, 1604) on a first sidewall and a bottom surface of the second conductive gate, wherein the first sidewall of the second conductive gate is perpendicular to the major surface of the substrate, a first insulator (702, 1802) over a top surface of the first conductive gate, wherein the top surface of the first conductive gate is opposite the bottom surface of the first conductive gate, and a second insulator (704, 1804) on a top surface of the second conductive gate. The top surface of the second conductive gate can be opposite the bottom surface of the second conductive gate. A first heavily doped region (N+ 804, 2006) of a first conductivity type can be at a surface of the semiconductor layer, adjacent the first insulator. A second heavily doped region (N+ 806, 2008) of the first conductivity type can be at the surface of the semiconductor layer, adjacent the second insulator. A first doped region of the first conductivity type (N 506, 1606) can be under the first conductive gate, extending from the first gate oxide on the bottom surface of the first conductive gate towards the substrate. A second doped region of the first conductivity type (N 508, 1608) can be under the second conductive gate, extending from the second gate oxide on the bottom surface of the second conductive gate towards the substrate. A first doped region of a second conductivity type (PHV 708, 1906), opposite the first conductivity type, can be under the top surfaces of the first and second conductive gates and extending laterally from the first gate oxide on the first sidewall of the first conductive gate to the second gate oxide on the first sidewall of the second conductive gate. A heavily doped region of the second conductivity type (812, 2206) can be at the surface of the semiconductor layer. The heavily doped region of the second conductivity type can be laterally between the first and second heavily doped regions of the first conductivity type at the surface of the semiconductor layer.

In another aspect, the device can further comprise a first shallow trench isolation (STI) region (208,1202) in the semiconductor layer above the first doped region of the second conductivity type; and a second STI region (210, 1204) in the semiconductor layer above the first doped region of the second conductivity type. The first STI can be between the first heavily doped region of the first conductivity type and the heavily doped region of the second conductivity type, and the second STI can be between the heavily doped region of the second conductivity type and the second heavily doped region of the first conductivity type.

In another aspect, a first vertical channel region can be located between the first heavily doped region of the first conductivity type and the first doped region of the first conductivity type, adjacent the first sidewall of the first conductive gate, and a second vertical channel region can be located between the second heavily doped region of the first conductivity type and the second doped region of the first conductivity type, adjacent the first sidewall of the second conductive gate.

In another aspect, the device can further comprise a second doped region of the second conductivity type (Plink 716, 2008) in the semiconductor layer between the heavily doped region of the second conductivity type and the first doped region of the second conductivity type.

In another aspect, the semiconductor layer can comprise a first epitaxial layer (104) of the first conductivity type on the substrate, a first epitaxial layer (106) of the second conductivity type over the first epitaxial layer of the first conductivity type, and a second epitaxial layer (108) of the first conductive type over the first epitaxial layer of the second conductivity type. A top surface of the second epitaxial layer of the first conductive type can provide the top surface of the semiconductor layer. The first doped region of the first conductivity type under the first conductive gate can extend from the first gate oxide through the first epitaxial layer of the second conductivity type, and the second doped region of the first conductivity type under the second conductive gate can extend through the first epitaxial layer of the second conductivity type.

In another aspect, the semiconductor layer can comprise a first epitaxial layer (904) of the first conductivity type on the substrate, and a second epitaxial layer (908) of the second conductivity type over the first epitaxial layer of the first conductivity type. A top surface of the second epitaxial layer of the second conductivity type can provide the top surface of the semiconductor layer. The device can further comprise a well region (906) of the second conductivity type in the first epitaxial layer. The first doped region of the first conductivity type under the first conductive gate can extend vertically from the first gate oxide through the well region, and the second doped region of the first conductivity type under the second conductive gate can extend vertically through the well region. The first and second conductive gates can extend vertically through the second epitaxial layer and into the well region.

In other embodiments, a method of forming a vertical bi-directional device, can comprise forming a semiconductor layer (104, 106, 108 or 904,908) over a substrate (102), forming a shallow trench isolation (STI) region (208, 1202) in the semiconductor layer, forming a trench (402, 1406) in the semiconductor layer, laterally spaced from the STI region, forming a gate oxide layer (602, 1602) along a bottom of the trench and along a sidewall of the trench, performing a first implant through the bottom of the trench into the semiconductor layer to form a first doped region of a first conductivity type (N 506, 1606) extending from the gate oxide along the bottom of the trench towards the substrate, forming a conductive gate (606, 1702) in the trench, wherein a top surface of the conductive gate is recessed as compared to a top surface of the semiconductor layer, and forming an insulator (702, 1802) over the conductive gate. A top surface of the insulator can be coplanar with the top surface of the semiconductor layer. A second implant through a top surface of the semiconductor layer can be performed to form a first doped region of a second conductivity type (PHV 708, 1906), opposite the first conductivity type. The first doped region can extend laterally from the gate oxide layer along the sidewall of the trench and under the STI region. A third implant through the top surface of the semiconductor layer can be performed to form a first heavily doped region of the first conductivity type (N+ 804, 2006) laterally between the insulator and the STI region. A fourth implant through the top surface of the semiconductor layer can be performed to form a first heavily doped region of the second conductivity (P+ 812, 2206) at the top surface of the semiconductor layer adjacent the STI region, wherein the STI region can be laterally between the first heavily doped region of the first conductivity type (N+) and the first heavily doped region of the second conductivity type (P+).

In another aspect, forming the semiconductor layer over the substrate can comprise epitaxially growing a first epitaxial layer (904) of the first conductivity type, and epitaxially growing a second epitaxial layer (908) of the first conductivity type on the first epitaxial layer of the first conductivity type. A top surface of the second epitaxial layer of the first conductivity type provides the top surface of the semiconductor layer.

In another aspect, the method can further comprise performing a fifth implant through the top surface of the semiconductor layer to form a well region of the second conductivity type (Deep P-well 906) which extends towards the substrate, wherein the second implant is performed into the well region.

In another aspect, the well region of the second conductivity type may not extend all the way to the substrate, and the first doped region of the first conductivity type can extend from the gate oxide layer along the bottom of the trench towards the substrate fully through the well region.

In another aspect, the method can further comprise performing a sixth implant through the top surface of the semiconductor layer to form a second doped region of the second conductivity type (Plink 1000, 2108). The semiconductor layer between the STI region and the insulator can be masked during the sixth implant.

In another aspect, a portion of the second epitaxial layer (908) of the first conductivity type can remain as the first conductivity type (N Epi) laterally between the STI and the insulator and vertically between the first heavily doped region of the first conductivity type (N+ 2008) and the first doped region of the second conductivity type (PHV), and extending under the STI region.

In another aspect, the heavily doped region of the second conductivity type (P+) is formed in the second doped region of the second conductivity type (Plink).

In another aspect, forming the semiconductor layer over the substrate can comprise epitaxially growing a first epitaxial layer (104) of the first conductivity type on the substrate, epitaxially growing a first epitaxial layer (106) of the second conductivity type on the first epitaxial layer of the first conductivity type, and epitaxially growing a second epitaxial layer (108) of the first conductivity type on the second epitaxial layer. A top surface of the third epitaxial layer can provide the top surface of the semiconductor layer.

In another aspect, performing the first implant can be performed such that the first doped region of a first conductivity type (N 506) extends from the gate oxide along the bottom of the trench through the first epitaxial layer of the first conductivity type.

In another aspect, the method can further comprise performing a fifth implant through the top surface of the second epitaxial layer (108) of the first conductivity type to form a second doped region of the second conductivity type (Plink 716). The second doped region of the second conductivity type can contact the first doped region of the second conductivity type.

In another aspect, the heavily doped region of the second conductivity type (P+) can be formed in the second doped region of the second conductivity type (Plink).

In another aspect, the first heavily doped region of the first conductivity type can be formed in the second epitaxial layer (108) of the first conductivity type.

In further embodiments, a vertical bi-directional device can comprise a substrate (902) having a first conductivity type, a first semiconductor layer (904) having the first conductivity type on the substrate, a second semiconductor layer (908) having the first conductivity type and on the first semiconductor layer, a first shallow trench isolation (STI) region (1202) and a second STI region (1204) in the second semiconductor layer, a well region (906) in the first semiconductor layer having a second conductivity type, opposite the first conductivity type, a first conductive gate (1702) in the second semiconductor layer and extending into the well region of the first semiconductor layer, recessed from a top surface of the second semiconductor layer, and a first gate oxide (1602) on a first sidewall and a bottom surface of the first conductive gate. The first sidewall of the first conductive gate can be perpendicular to a major surface of the substrate. A second conductive gate (1704) can be in the second semiconductor layer and extending into the well region of the first semiconductor layer, recessed from a top surface of the second semiconductor layer. A second gate oxide (1604) can be on a first sidewall and a bottom surface of the second conductive gate. The first sidewall of the second conductive gate can be perpendicular to a major surface of the substrate. The first and second STI regions can be laterally between the first and second conductive gates. A first insulator (1802) can be over a top surface of the first conductive gate. The top surface of the first conductive gate can be opposite the bottom surface of the first conductive gate. A second insulator (1804) can be on a top surface of the second conductive gate. The top surface of the second conductive gate can be opposite the bottom surface of the second conductive gate. A first heavily doped region (P+ 2006) of the first conductivity type can be at the top surface of the second semiconductor layer, laterally between the first insulator and the first STI. A second heavily doped region (P+ 2008) of the first conductivity type can be at the top surface of the second semiconductor layer, laterally between the second STI and the second insulator. A first doped region of the first conductivity type (N 1606) can be under the first conductive gate, extending from the first gate oxide on the bottom surface of the first conductive gate to a bottom of the well region. A second doped region of the first conductivity type (N 1608) can be under the second conductive gate, extending from the second gate oxide on the bottom surface of the second conductive gate to the bottom of the well region. A first doped region of a second conductivity type (PHV 1906) can be in the well region, under the first and second STI regions, and extending laterally from the first gate oxide on the first sidewall of the first conductive gate to the second gate oxide on the first sidewall of the second conductive gate. A heavily doped region of the second conductivity type (P+ 2206) can be at the top surface of the second semiconductor layer, laterally between the first and second STI regions.

In another aspect, the device of claim can further comprise a second doped region of the second conductivity type (Plink 2108) in the second semiconductor layer vertically between the heavily doped region of the second conductivity type (P+ 2206) and the first doped region of the second conductivity type (PHV 1906). The second dope region can physically contact both the heavily doped region of the second conductivity type and the first doped region of the second conductivity type.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A vertical bi-directional device comprising:
a substrate;
a semiconductor layer over the substrate;
a first conductive gate in the semiconductor layer, recessed from a top surface of the semiconductor layer;
a first gate oxide on a first sidewall and a bottom surface of the first conductive gate, wherein the first sidewall of the first conductive gate is perpendicular to a major surface of the substrate;
a second conductive gate in the semiconductor layer, recessed from the top surface of the semiconductor layer;
a second gate oxide on a first sidewall and a bottom surface of the second conductive gate, wherein the first sidewall of the second conductive gate is perpendicular to the major surface of the substrate;
a first insulator over a top surface of the first conductive gate, wherein the top surface of the first conductive gate is opposite the bottom surface of the first conductive gate;
a second insulator on a top surface of the second conductive gate, wherein the top surface of the second conductive gate is opposite the bottom surface of the second conductive gate
a first heavily doped region of a first conductivity type at a surface of the semiconductor layer, adjacent the first insulator;
a second heavily doped region of the first conductivity type at the surface of the semiconductor layer, adjacent the second insulator;
a first doped region of the first conductivity type under the first conductive gate, extending from the first gate oxide on the bottom surface of the first conductive gate towards the substrate;
a second doped region of the first conductivity type under the second conductive gate, extending from the second gate oxide on the bottom surface of the second conductive gate towards the substrate;
a first doped region of a second conductivity type, opposite the first conductivity type, under the top surfaces of the first and second conductive gates and extending laterally from the first gate oxide on the first sidewall of the first conductive gate to the second gate oxide on the first sidewall of the second conductive gate; and
a heavily doped region of the second conductivity type at the surface of the semiconductor layer, wherein the heavily doped region of the second conductivity type is laterally between the first and second heavily doped regions of the first conductivity type at the surface of the semiconductor layer.

2. The device of claim 1, further comprising:
a first shallow trench isolation (STI) region in the semiconductor layer above the first doped region of the second conductivity type; and
a second STI region in the semiconductor layer above the first doped region of the second conductivity type, wherein the first STI is between the first heavily doped region of the first conductivity type and the heavily doped region of the second conductivity type, and the second STI is between the heavily doped region of the second conductivity type and the second heavily doped region of the first conductivity type.

3. The device of claim 1, wherein a first vertical channel region is located between the first heavily doped region of the first conductivity type and the first doped region of the first conductivity type, adjacent the first sidewall of the first conductive gate, and a second vertical channel region is located between the second heavily doped region of the first conductivity type and the second doped region of the first conductivity type, adjacent the first sidewall of the second conductive gate.

4. The device of claim 1, further comprising:
a second doped region of the second conductivity type in the semiconductor layer between the heavily doped region of the second conductivity type and the first doped region of the second conductivity type.

5. The device of claim 1, wherein the semiconductor layer comprises:
a first epitaxial layer of the first conductivity type on the substrate;
a first epitaxial layer of the second conductivity type over the first epitaxial layer of the first conductivity type; and
a second epitaxial layer of the first conductive type over the first epitaxial layer of the second conductivity type, wherein a top surface of the second epitaxial layer of the first conductive type provides the top surface of the semiconductor layer, and wherein the first doped region of the first conductivity type under the first conductive gate extends from the first gate oxide through the first epitaxial layer of the second conductivity type, and the second doped region of the first conductivity type under the second conductive gate extends through the first epitaxial layer of the second conductivity type.

6. The device of claim 1, wherein the semiconductor layer comprises:
a first epitaxial layer of the first conductivity type on the substrate;
a second epitaxial layer of the second conductivity type over the first epitaxial layer of the first conductivity type, wherein a top surface of the second epitaxial layer of the second conductivity type provides the top surface of the semiconductor layer;
and the device further comprises:
a well region of the second conductivity type in the first epitaxial layer, wherein the first doped region of the first conductivity type under the first conductive gate extends vertically from the first gate oxide through the well region, and the second doped region of the first conductivity type under the second conductive gate extends vertically through the well region, and wherein the first and second conductive gates extend vertically through the second epitaxial layer and into the well region.

7. A method of forming a vertical bi-directional device, comprising:
forming a semiconductor layer over a substrate;
forming a shallow trench isolation (STI) region in the semiconductor layer;
forming a trench in the semiconductor layer, laterally spaced from the STI region;
forming a gate oxide layer along a bottom of the trench and along a sidewall of the trench;
performing a first implant through the bottom of the trench into the semiconductor layer to form a first doped region of a first conductivity type extending from the gate oxide along the bottom of the trench towards the substrate;
forming a conductive gate in the trench, wherein a top surface of the conductive gate is recessed as compared to a top surface of the semiconductor layer;
forming an insulator over the conductive gate, wherein a top surface of the insulator is coplanar with the top surface of the semiconductor layer;
performing a second implant through a top surface of the semiconductor layer to form a first doped region of a second conductivity type, opposite the first conductivity type, wherein the first doped region extends laterally from the gate oxide layer along the sidewall of the trench and under the STI region;
performing a third implant through the top surface of the semiconductor layer to form a first heavily doped region of the first conductivity type laterally between the insulator and the STI region; and
performing a fourth implant through the top surface of the semiconductor layer to form a first heavily doped region of the second conductivity at the top surface of the semiconductor layer adjacent the STI region, wherein the STI region is laterally between the first heavily doped region of the first conductivity type and the first heavily doped region of the second conductivity type.

8. The method of claim 7, wherein forming the semiconductor layer over the substrate comprises:
epitaxially growing a first epitaxial layer of the first conductivity type; and
epitaxially growing a second epitaxial layer of the first conductivity type on the first epitaxial layer of the first conductivity type, wherein a top surface of the second epitaxial layer of the first conductivity type provides the top surface of the semiconductor layer.

9. The method of claim 8, further comprising:
performing a fifth implant through the top surface of the semiconductor layer to form a well region of the second conductivity type which extends towards the substrate, wherein the second implant is performed into the well region.

10. The method of claim 9, wherein the well region of the second conductivity type does not extend all the way to the substrate, and the first doped region of the first conductivity type extends from the gate oxide layer along the bottom of the trench towards the substrate fully through the well region.

11. The method of claim 9, further comprising:
performing a sixth implant through the top surface of the semiconductor layer to form a second doped region of the second conductivity type, wherein the semiconductor layer between the STI region and the insulator is masked during the sixth implant.

12. The method of claim 11, wherein a portion of the second epitaxial layer of the first conductivity type remains as the first conductivity type laterally between the STI and the insulator and vertically between the first heavily doped region of the first conductivity type and the first doped region of the second conductivity type, and extending under the STI region.

13. The method of claim 11, wherein the heavily doped region of the second conductivity type is formed in the second doped region of the second conductivity type.

14. The method of claim 7, wherein forming the semiconductor layer over the substrate comprises:
  epitaxially growing a first epitaxial layer of the first conductivity type on the substrate;
  epitaxially growing a first epitaxial layer of the second conductivity type on the first epitaxial layer of the first conductivity type; and
  epitaxially growing a second epitaxial layer of the first conductivity type on the second epitaxial layer, wherein a top surface of the third epitaxial layer provides the top surface of the semiconductor layer.

15. The method of claim 14, wherein performing the first implant is performed such that the first doped region of a first conductivity type extends from the gate oxide along the bottom of the trench through the first epitaxial layer of the first conductivity type.

16. The method of claim 15, further comprising:
  performing a fifth implant through the top surface of the second epitaxial layer of the first conductivity type to form a second doped region of the second conductivity type, wherein the second doped region of the second conductivity type contacts the first doped region of the second conductivity type.

17. The method of claim 16, wherein the heavily doped region of the second conductivity type is formed in the second doped region of the second conductivity type.

18. The method of claim 17, wherein the first heavily doped region of the first conductivity type is formed in the second epitaxial layer of the first conductivity type.

19. A vertical bi-directional device comprising:
  a substrate having a first conductivity type;
  a first semiconductor layer having the first conductivity type on the substrate;
  a second semiconductor layer having the first conductivity type and on the first semiconductor layer;
  a first shallow trench isolation (STI) region and a second STI region in the second semiconductor layer;
  a well region in the first semiconductor layer having a second conductivity type, opposite the first conductivity type;
  a first conductive gate in the second semiconductor layer and extending into the well region of the first semiconductor layer, recessed from a top surface of the second semiconductor layer;
  a first gate oxide on a first sidewall and a bottom surface of the first conductive gate, wherein the first sidewall of the first conductive gate is perpendicular to a major surface of the substrate;
  a second conductive gate in the second semiconductor layer and extending into the well region of the first semiconductor layer, recessed from a top surface of the second semiconductor layer;
  a second gate oxide on a first sidewall and a bottom surface of the second conductive gate, wherein the first sidewall of the second conductive gate is perpendicular to a major surface of the substrate, wherein the first and second STI regions are laterally between the first and second conductive gates;
  a first insulator over a top surface of the first conductive gate, wherein the top surface of the first conductive gate is opposite the bottom surface of the first conductive gate;
  a second insulator on a top surface of the second conductive gate, wherein the top surface of the second conductive gate is opposite the bottom surface of the second conductive gate a first heavily doped region of the first conductivity type at the top surface of the second semiconductor layer, laterally between the first insulator and the first STI;
  a second heavily doped region of the first conductivity type at the top surface of the second semiconductor layer, laterally between the second STI and the second insulator;
  a first doped region of the first conductivity type under the first conductive gate, extending from the first gate oxide on the bottom surface of the first conductive gate to a bottom of the well region;
  a second doped region of the first conductivity type under the second conductive gate, extending from the second gate oxide on the bottom surface of the second conductive gate to the bottom of the well region;
  a first doped region of a second conductivity type in the well region, under the first and second STI regions, and extending laterally from the first gate oxide on the first sidewall of the first conductive gate to the second gate oxide on the first sidewall of the second conductive gate; and
  a heavily doped region of the second conductivity type at the top surface of the second semiconductor layer, laterally between the first and second STI regions.

20. The device of claim 19, further comprising:
  a second doped region of the second conductivity type in the second semiconductor layer vertically between the heavily doped region of the second conductivity type and the first doped region of the second conductivity type, wherein the second dope region physically contacts both the heavily doped region of the second conductivity type and the first doped region of the second conductivity type.

* * * * *